(12) United States Patent
Lee et al.

(10) Patent No.: US 10,032,789 B2
(45) Date of Patent: Jul. 24, 2018

(54) THREE-DIMENSIONAL SEMICONDUCTOR MEMORY DEVICE

(71) Applicant: Samsung Electronics Co., Ltd., Suwon-si (KR)

(72) Inventors: Dohyun Lee, Hwaseong-si (KR); Younghwan Son, Hwaseong-si (KR); Minyeong Song, Seoul (KR); Youngwoo Park, Seoul (KR); Jaeduk Lee, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 62 days.

(21) Appl. No.: 15/208,669

(22) Filed: Jul. 13, 2016

(65) Prior Publication Data

US 2017/0047343 A1 Feb. 16, 2017

(30) Foreign Application Priority Data

Aug. 11, 2015 (KR) .................. 10-2015-0113227

(51) Int. Cl.
*H01L 27/115* (2017.01)
*H01L 29/167* (2006.01)
(Continued)

(52) U.S. Cl.
CPC .. *H01L 27/11582* (2013.01); *H01L 27/11529* (2013.01); *H01L 27/11556* (2013.01); *H01L 27/11573* (2013.01); *H01L 29/167* (2013.01)

(58) Field of Classification Search
CPC .................................................... H01L 23/528
See application file for complete search history.

(56) References Cited

U.S. PATENT DOCUMENTS 6,531,409 B1 3/2003 Iwabuchi
6,635,950 B1 10/2003 Ishida et al.
(Continued)

FOREIGN PATENT DOCUMENTS

JP 4370678 9/2009
JP 2010-092988 A 4/2010
(Continued)

*Primary Examiner* — Jesse Y Miyoshi
*Assistant Examiner* — John Bodnar
(74) *Attorney, Agent, or Firm* — Muir Patent Law, PLLC

(57) ABSTRACT

Provided is a three-dimensional semiconductor memory device including a peripheral logic structure on a semiconductor substrate to include peripheral logic circuits and a lower insulating gapfill layer, a horizontal semiconductor layer on the peripheral logic structure, stacks on the horizontal semiconductor layer, each of the stacks including a plurality of electrodes vertically stacked on the horizontal semiconductor layer, and a plurality of vertical structures passing through the stacks and connected to the horizontal semiconductor layer. The horizontal semiconductor layer may include a first semiconductor layer disposed on the lower insulating gapfill layer and co-doped with an anti-diffusion material and first conductivity type impurities of a first impurity concentration, and a second semiconductor layer disposed on the first semiconductor layer and doped with first conductivity type impurities of a second impurity concentration lower than the first impurity concentration or undoped.

23 Claims, 19 Drawing Sheets

(51) Int. Cl.
*G11C 16/10* (2006.01)
*G11C 16/26* (2006.01)
*G11C 16/08* (2006.01)
*H01L 27/11582* (2017.01)
*H01L 27/11529* (2017.01)
*H01L 27/11556* (2017.01)
*H01L 27/11573* (2017.01)

(56) References Cited

U.S. PATENT DOCUMENTS

| | | |
|---|---|---|
| 7,679,133 B2 | 3/2010 | Son et al. |
| 8,338,882 B2 | 12/2012 | Tanaka et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,087,789 B2 | 7/2015 | Cho et al. |
| 2011/0233648 A1 | 9/2011 | Seol et al. |
| 2013/0323915 A1 | 12/2013 | Komori et al. |
| 2015/0372005 A1* | 12/2015 | Yon .................. H01L 27/11582 257/5 |

FOREIGN PATENT DOCUMENTS

| | | |
|---|---|---|
| KR | 10-2008-0033561 A | 4/2008 |
| KR | 10-1394701 | 5/2014 |
| KR | 10-2016-0000047 A | 1/2016 |

\* cited by examiner

THREE-DIMENSIONAL SEMICONDUCTOR MEMORY DEVICE

CROSS-REFERENCE TO RELATED APPLICATIONS

This U.S. non-provisional patent application claims the benefit of priority under 35 U.S.C. § 119 to Korean Patent Application No. 10-2015-0113227, filed on Aug. 11, 2015, in the Korean Intellectual Property Office, the entire contents of which are hereby incorporated by reference.

BACKGROUND

The disclosed embodiments relate to three-dimensional semiconductor memory devices, and in particular, to three-dimensional semiconductor memory devices with improved reliability and a higher integration density.

Higher integration of semiconductor devices satisfies consumer demands for superior performance and inexpensive prices. In the case of semiconductor devices, since their integration is an important factor in determining product prices, increased integration is especially valuable. In the case of typical two-dimensional or planar semiconductor memory devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, there have been recently proposed three-dimensional semiconductor memory devices including three-dimensionally arranged memory cells.

SUMMARY

Example embodiments provide a highly-reliable high-density three-dimensional semiconductor memory device.

According to example embodiments, a three-dimensional semiconductor memory device may include a peripheral logic structure on a semiconductor substrate, the peripheral logic structure including peripheral logic circuits integrated on the semiconductor substrate and a lower insulating gapfill layer covering the peripheral logic circuits, a horizontal semiconductor layer on the peripheral logic structure, stacks on the horizontal semiconductor layer, each of the stacks including a plurality of electrodes vertically stacked on the horizontal semiconductor layer, and a plurality of vertical structures passing through the stacks and connected to the horizontal semiconductor layer. The horizontal semiconductor layer may include a first semiconductor layer provided on the lower insulating gapfill layer and co-doped with an anti-diffusion material and first conductivity type impurities of a first impurity concentration, and a second semiconductor layer provided on the first semiconductor layer, the second semiconductor layer being undoped or doped with first conductivity type impurities of a second impurity concentration lower than the first impurity concentration.

In example embodiments, in the first semiconductor layer, a concentration of the anti-diffusion material may be higher than the first impurity concentration of the first conductivity type impurities.

In example embodiments, the horizontal semiconductor layer may further include a third semiconductor layer disposed between the lower insulating gapfill layer and the first semiconductor layer, and the third semiconductor layer may be doped with first conductivity type impurities of a third impurity concentration higher than the first impurity concentration.

In example embodiments, a thickness of the second semiconductor layer may be greater than a sum of thicknesses of the first and third semiconductor layers.

In example embodiments, the horizontal semiconductor layer may further include a fourth semiconductor layer disposed between the first and second semiconductor layers. The fourth semiconductor layer may be doped with the anti-diffusion material.

In example embodiments, a concentration of the anti-diffusion material in the fourth semiconductor layer may be higher than a concentration of the anti-diffusion material in the first semiconductor layer.

In example embodiments, a thickness of the first semiconductor layer may be greater than that of the fourth semiconductor layer. In example embodiments, the anti-diffusion material may contain carbon (C).

In example embodiments, a thickness of the second semiconductor layer may be greater than half a thickness of the horizontal semiconductor layer.

In example embodiments, the stacks may extend parallel to each other, in a direction on the horizontal semiconductor layer. The second semiconductor layer may include a common source region, which is formed between the stacks to extend in the direction and is doped with second conductivity type impurities, and a concentration of the second conductivity type impurities doped in the common source region may be higher than the first impurity concentration of the first conductivity type impurities doped in the second semiconductor layer.

According to example embodiments, a three-dimensional semiconductor memory device may include a peripheral logic structure on a semiconductor substrate, the peripheral logic structure including peripheral logic circuits integrated on the semiconductor substrate and a lower insulating gapfill layer covering the peripheral logic circuits, and a horizontal semiconductor layer on the peripheral logic structure. The horizontal semiconductor layer may include a first impurity layer provided adjacent to the lower insulating gapfill layer and doped with p-type impurities of a first impurity concentration and anti-diffusion material, a channel layer on the first impurity layer, the channel layer being undoped or doped with the p-type impurities of a second impurity concentration lower than the first impurity concentration, a second impurity layer between the channel layer and the first impurity layer and doped with the anti-diffusion material, and a third impurity layer between the first and second impurity layers and co-doped with the p-type impurities and the anti-diffusion material. The three-dimensional semiconductor memory device may further include a plurality of stacks on the horizontal semiconductor layer, each of the stacks including a plurality of electrodes vertically stacked on the horizontal semiconductor layer, a plurality of vertical structures passing through the stacks and connected to the channel layer, and a common source region disposed in the channel layer and between the stacks and doped with n-type impurities.

In example embodiments, a concentration of the p-type impurities may be lower in the third impurity layer than in the first impurity layer.

In example embodiments, the third impurity layer may be thicker than the first impurity layer or the second impurity layer.

In example embodiments, a concentration of the anti-diffusion material may be lower in the third impurity layer than in the second impurity layer.

In example embodiments, a doping concentration of the p-type impurities in the horizontal semiconductor layer gradually may decrease in a direction from the peripheral circuit structure toward the vertical structures, a doping concentration of the n-type impurities in the horizontal semiconductor layer may gradually decrease in a direction from the vertical structures toward the peripheral circuit structure, and the horizontal semiconductor layer may include a pn junction formed at a region adjacent to the second impurity layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein. In the drawings.

Figure 1:
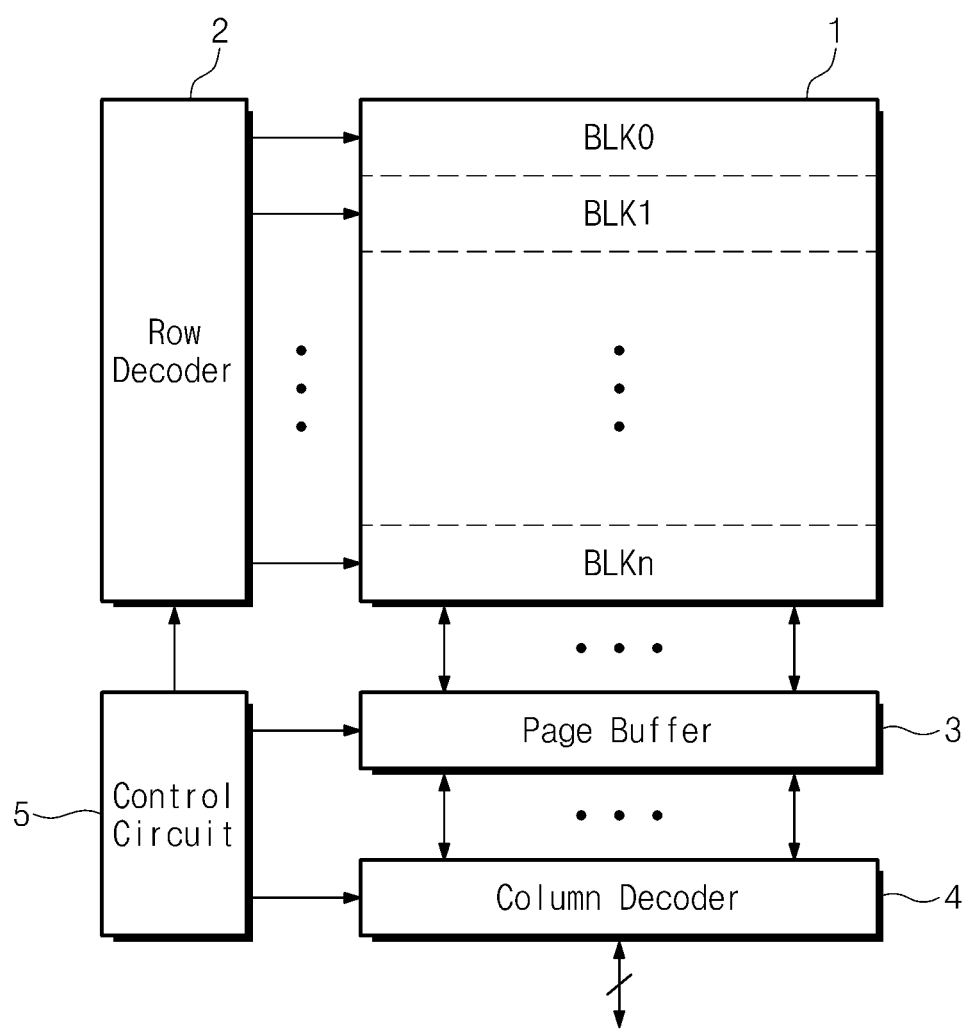
FIG. 1 is a schematic block diagram illustrating a three-dimensional semiconductor memory device according to certain example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

It will be understood that when an element is referred to as being "on," "connected to," "electrically connected to," or "coupled to" another element, it can be directly on, connected to, electrically connected to, or coupled to the other element or intervening elements may be present. In contrast, when an element is referred to as being "directly on," "directly connected to," "directly electrically connected to," or "directly coupled to" another component, or as "contacting" or "in contact with" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the text indicates otherwise, these terms are only used to distinguish one element, component, region, layer or section from another element, component, region, layer or section. For example, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing certain embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to limit the scope of the example embodiments.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

Unless otherwise defined, all terms (including technical and scientific terms) used herein have the same meaning as commonly understood by one of ordinary skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory. A chip or package that includes the semiconductor devices may also be referred to generally as a semiconductor device.

Reference will now be made to example embodiments, which are illustrated in the accompanying drawings, wherein like reference numerals may refer to like components throughout.

FIG. 1 is a schematic block diagram illustrating a three-dimensional (3D) semiconductor memory device according to certain example embodiments.

Referring to FIG. 1, a 3D semiconductor memory device may include a memory cell array 1, a row decoder 2, a page buffer 3, a column decoder 4, and a control circuits 5.

The memory cell array 1 may include a plurality of memory blocks BLK0-BLKn (e.g., BLK0, BLK1, BLK2 . . . BLKn–2, BLKn–1, BLKn), each of which may include a plurality of memory cells and a plurality of word and bit lines electrically connected to the memory cells. For example, each of the plurality of word and bit lines may be electrically connected to one or more of the plurality of memory cells.

The row decoder 2 may be configured to decode address information transmitted from the outside and select one of the word lines based on the decoded address information. For example, the row decoder 2 may receive address information received from one or more devices or units external to the row decoder 2. The address information decoded in the row decoder 2 may be transmitted to a row driver (not shown), and the row driver may supply word line voltages, which are generated by a voltage-generation circuit (not shown), to a selected word line and un-selected word lines, in response to the control of the control circuit 5. The row decoder 2 may be connected in common to the plurality of memory blocks BLK0-BLKn and may provide a driving signal to word lines of a selected one of the plurality of memory blocks BLK0-BLKn, based on a block selection signal.

The page buffer 3 may be connected to the memory cell array 1 through bit lines. The page buffer 3 may be connected to selected ones of the bit lines, based on address information decoded by the column decoder 4. Depending on an operation mode, each page buffer 3 may execute a process of temporarily storing data to be stored in the memory cells or of reading out and temporarily storing data stored in the memory cells. For example, the page buffer 3 may function as a write driver in a program operation mode or as a sense amplifier in a read operation mode. The page buffer 3 may receive power (e.g., voltage or current) from the control logic 3 and send it to the selected bit line.

The column decoder 4 may be configured to provide data-transmission paths between the page buffer 3 and an external device (e.g., a memory controller) (not shown). The column decoder 4 may be configured to decode the address information transmitted from the outside (e.g., an external device) and select one of the bit lines based on the decoded address information. The column decoder 4 may be connected in common to the plurality of memory blocks BLK0-BLKn and may provide data to the bit lines of one of the memory blocks BLK0-BLKn, which is selected on the basis of a block selection signal.

The control circuits 5 may be configured to control overall operations of the 3D semiconductor memory device. The control circuits 5 may receive a control signal and an external voltage and may perform a corresponding operation, based on the received control signal. The control circuits 5 may receive control signals from an external device, such as a memory controller (not shown), and may receive external voltage from a power supply (not shown). The control circuits 5 may generate voltages (e.g., program, read, erase voltages, etc.) necessary for internal operations by using the external voltage. The control circuits 5 may control read, write, and/or erase operations in response to the control signals.

Figure 2:
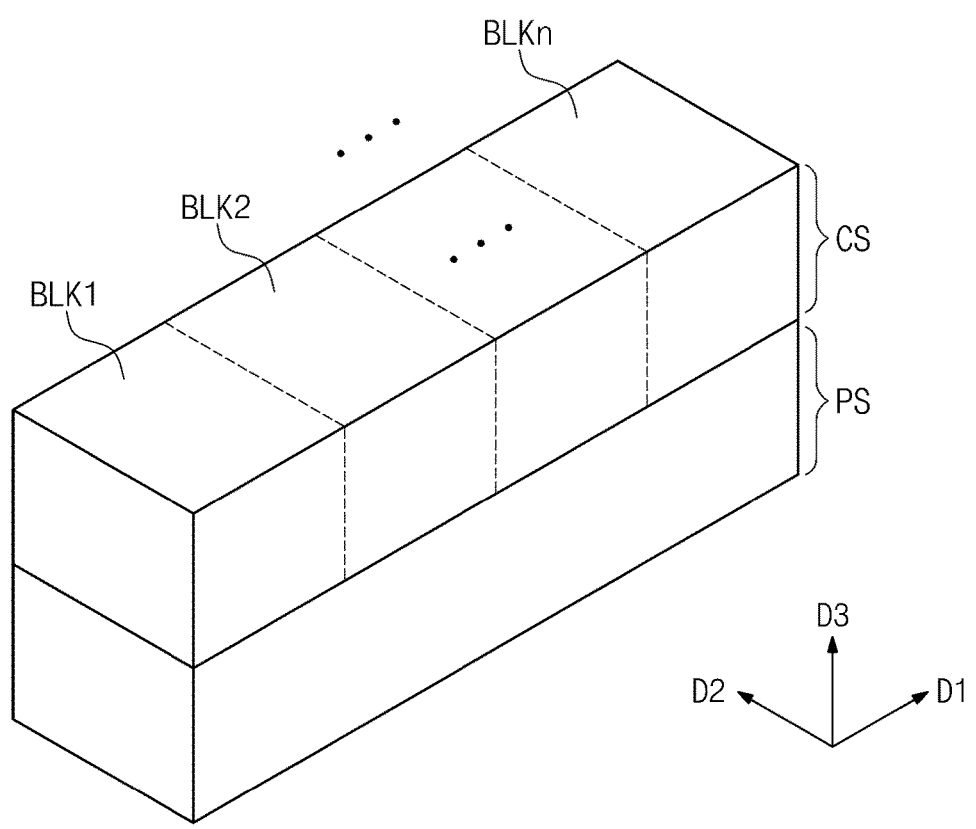
FIG. 2 is a schematic perspective view illustrating a three-dimensional semiconductor memory device according to certain example embodiments.

FIG. 2 is a schematic perspective view illustrating a 3D semiconductor memory device according to example embodiments.

Referring to FIG. 2, a 3D semiconductor memory device may include a peripheral logic structure PS and a cell array structure CS stacked on the peripheral logic structure PS. For example, the peripheral logic structure PS and the cell array structure CS may be overlapped with each other, when viewed in a plan view.

In some embodiments, the peripheral logic structure PS may include the row and column decoders 2 and 4, the page buffer 3, and the control circuits 5, such as those previously described with reference to FIG. 1. The cell array structure CS may include a plurality of memory blocks BLK0-BLKn, each of which is configured to independently perform an erase operation. The peripheral logic structure PS may be provided on a plane defined by first and second directions D1 and D2, and the memory blocks BLK1-BLKn may be provided on the peripheral logic structure PS in a third direction D3 normal to the plane. For example, the memory blocks BLK1-BLKn may be sequentially provided (e.g., BLK0, BLK1, BLK2 . . . BLKn–2, BLKn–1, BLKn) along the first direction D2 and stacked on the peripheral logic structure PS in the third direction D3. Each of the memory blocks BLK1-BLKn may include a 3D memory cell array, in which memory cells are vertically stacked. The memory cell array may include a plurality of 3D arranged memory cells and a plurality of word and bit lines electrically connected to the memory cells. The 3D memory cell array will be described in more detail with reference to FIG. 3.

Figure 3:
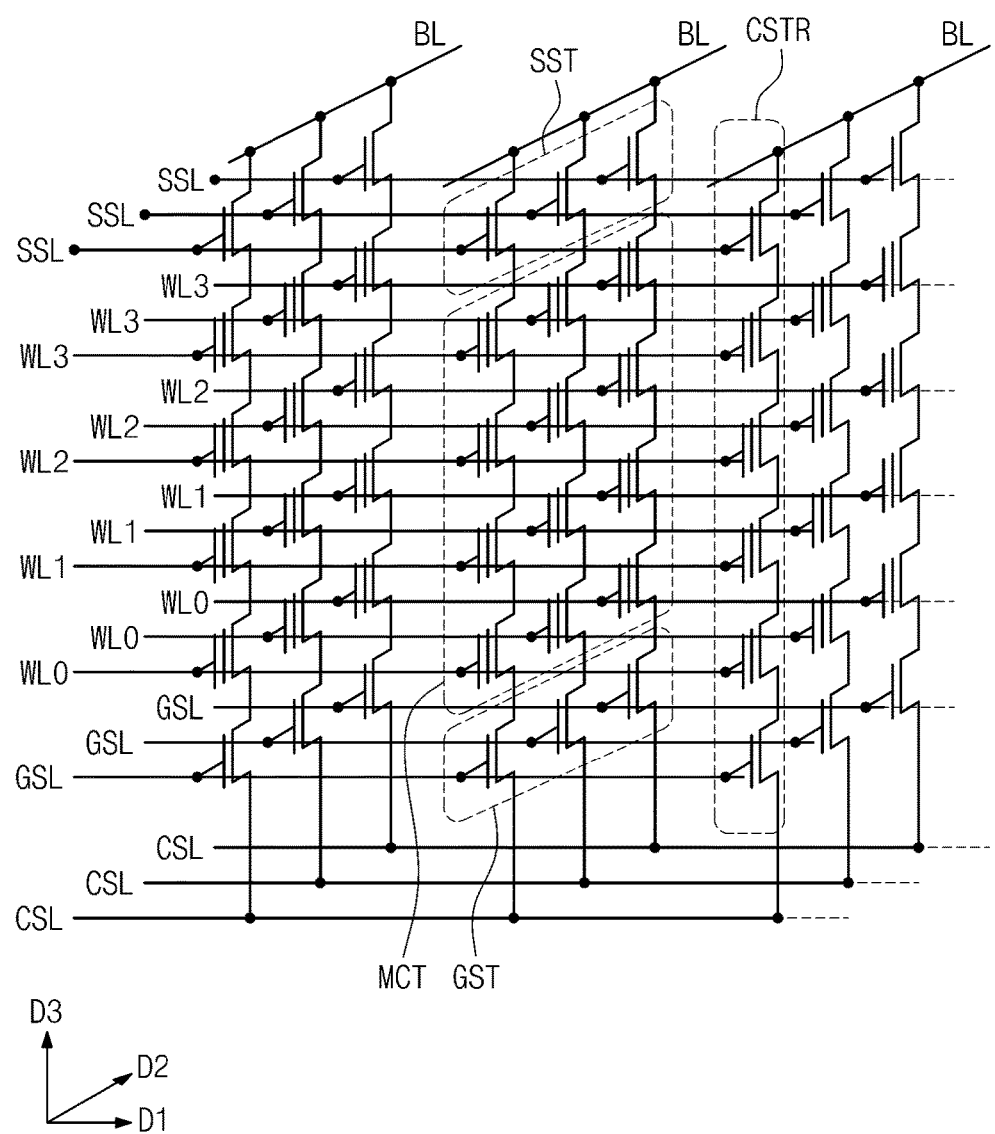
FIG. 3 is a schematic circuit diagram illustrating a cell array of a three-dimensional semiconductor memory device according to certain example embodiments.

FIG. 3 is a schematic circuit diagram illustrating a cell array of a 3D semiconductor memory device according to example embodiments.

Referring to FIG. 3, a cell array of a semiconductor memory device may include a common source line CSL, a plurality of bit lines BL, and a plurality of cell strings CSTR disposed between the common source line CSL and the bit lines BL.

The bit lines BL may be two-dimensionally arranged and each of the plurality of the cell strings CSTR may be connected in parallel to the bit lines BL. For example, each of the plurality of the cell strings CSTR may be connected to one of the bit lines BL. The cell strings CSTR may be connected in common to the common source line CSL. For instance, each of the plurality of the cell strings CSTR may be disposed between the common source line CSL and one of the bit lines BL. As an example, the cell array may include a plurality of two-dimensionally arranged common source lines CSL. In some embodiments, the plurality of common source lines CSL may be connected with each another and be in an equipotential state, but in certain embodiments, the common source lines CSL may be electrically separated from each other such that they can be controlled independently.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. The ground selection transistor GST, the memory cell transistors MCT, and the string selection transistor SST may be connected in series.

Source regions of the ground selection transistors GST may be connected in common to the common source line CSL. In addition, at least one ground selection line GSL, a plurality of word lines WL0-WL3, and a plurality of string selection lines SSL may be disposed between the common source line CSL and the bit lines BL to serve as gate electrodes EL of the ground selection transistor GST, the memory cell transistors MCT, and the string selection transistors SST, respectively. Furthermore, each of the memory cell transistors MCT may include a data storage element or a data storing layer. Although only four word lines WL0-WL3 are illustrated in FIG. 3 as being disposed between the ground selection line GSL and the string selection lines SSL for a cell string CSTR, it is anticipated that a cell strings CSTR may include any number of word lines (e.g., WL0, WL1, WL2, WL3 . . . WLn–1, WLn) disposed between the ground selection line GSL and the string selection lines SSL for each cell string CSTR.

Figure 4:
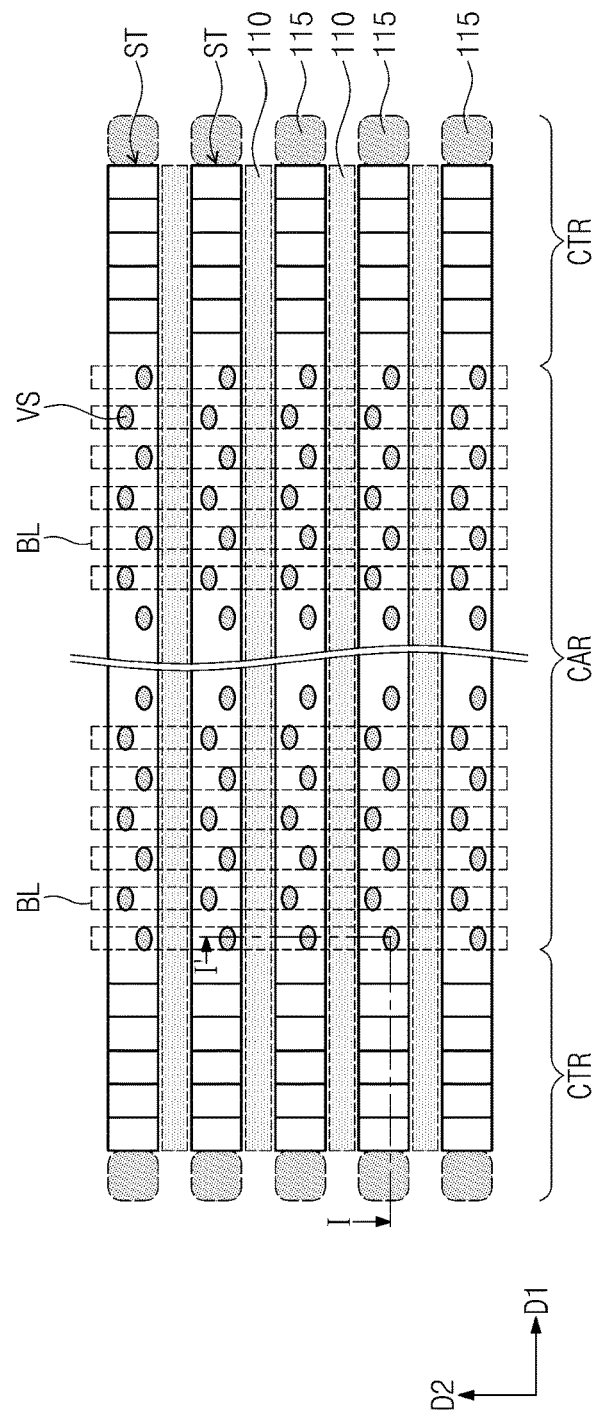
FIG. 4 is a plan view illustrating a three-dimensional semiconductor memory device according to certain example embodiments.
Figure 5:
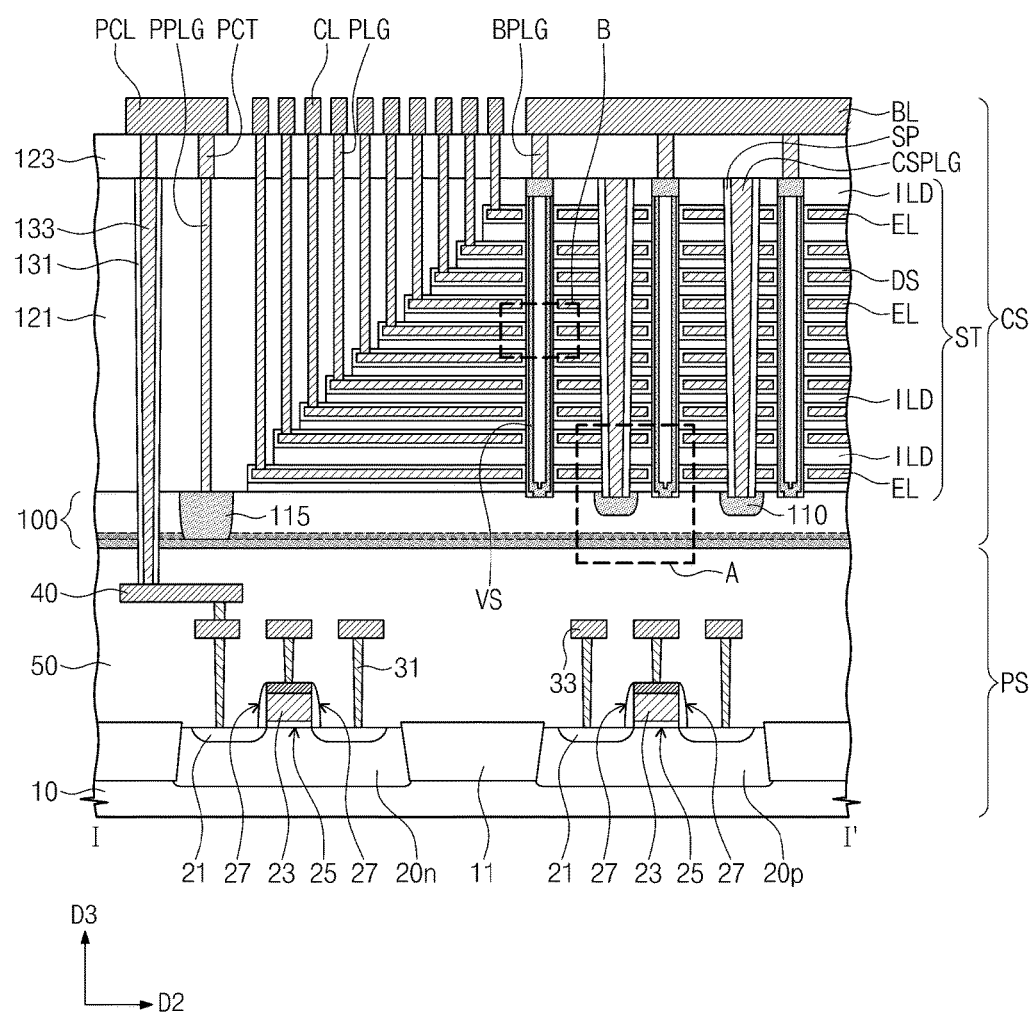
FIGS. 5 and 7 are sectional views, each of which is taken along line I-I' of FIG. 4 to illustrate a three-dimensional semiconductor memory device according to certain example embodiments.
Figure 6:
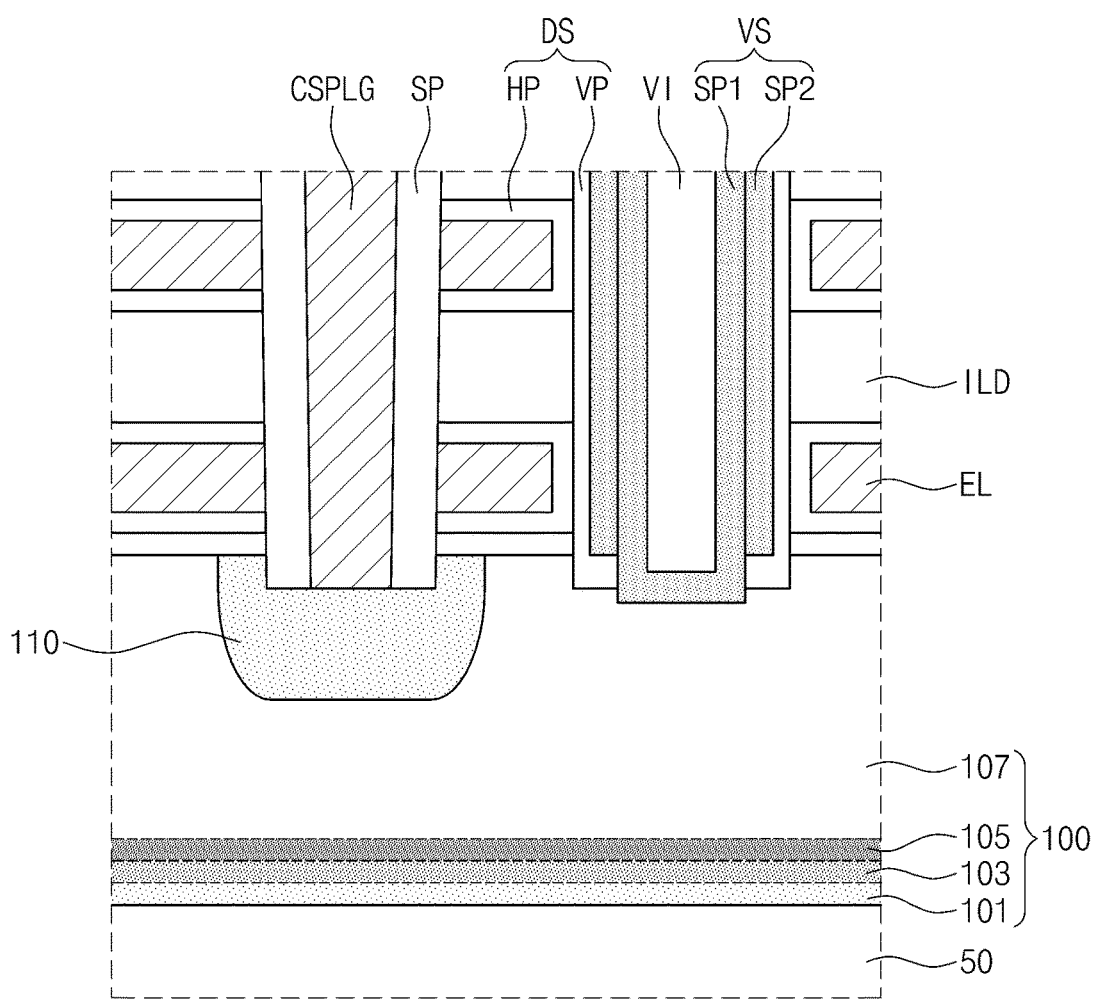
FIG. 6 is an enlarged view illustrating a portion 'A' of FIG. 5.
Figure 7:
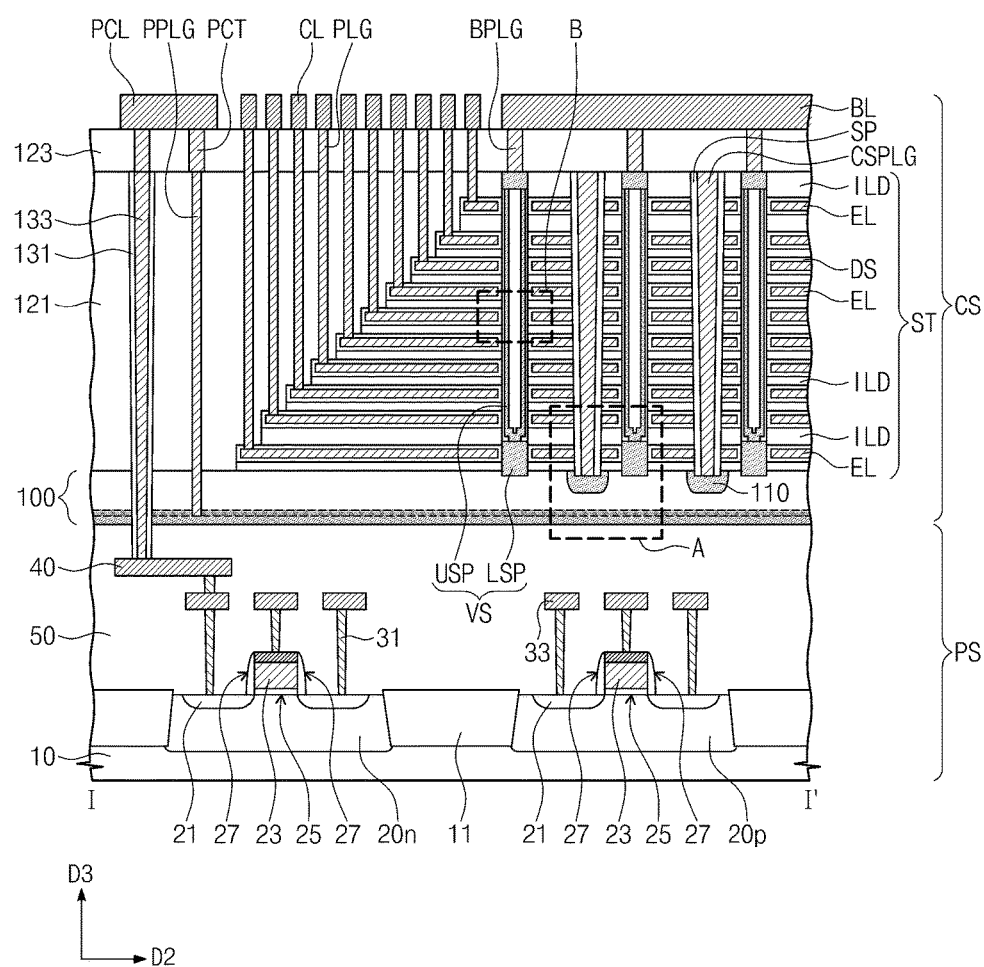

FIG. 4 is a plan view illustrating a 3D semiconductor memory device according to example embodiments. FIGS. 5 and 7 are sectional views, each of which is taken along line I-I' of FIG. 4 to illustrate a 3D semiconductor memory device according to example embodiments. FIG. 6 is an enlarged view illustrating a portion 'A' of FIG. 5.

Referring to FIGS. 4, 5, and 6, the peripheral logic structure PS and the cell array structure CS may be sequentially stacked on a semiconductor substrate 10. For example, the peripheral logic structure PS may be disposed between the semiconductor substrate 10 and the cell array structure CS, when viewed in a plan view. The peripheral circuit region and the cell array region may be overlapped with each other, when viewed in a plan view.

The peripheral logic structure PS may include peripheral circuits (e.g., the row and column decoders 2 and 4 of FIG. 1, the page buffer 3 of FIG. 1, and the control circuit 5 of FIG. 1), and such peripheral circuits may be formed on the entire top surface of the semiconductor substrate 10. The semiconductor substrate 10 may include an n-well region 20$n$ doped with n-type impurities and a p-well region 20$p$ doped with p-type impurities. The n-well region 20$n$ and the p-well region 20$p$ may include active regions defined by a device isolation layer 11.

The peripheral logic structure PS may include peripheral gate electrodes 23, source and drain impurity regions 21 disposed at both sides of the peripheral gate electrodes 23, peripheral contact plugs 31, peripheral interconnection lines 33 and 40, and a lower insulating gapfill layer 50 covering peripheral circuits. For example, p-channel metal oxide semiconductor (PMOS) transistors may be formed on the n-well region 20$n$, and n-channel metal oxide semiconductor (NMOS) transistors may be formed on the p-well region 20$p$. The peripheral gate electrodes 23 may be provided on the n-well region 20$n$ and the p-well region 20$p$ with a peripheral gate insulating layer 25 interposed therebetween, and the source and drain impurity regions 21 may be provided at both sides of each of the peripheral gate electrodes 23. Furthermore, peripheral gate spacers 27 may be provided on sidewalls of the peripheral gate electrode 23. The peripheral interconnection lines 33 and 40 may be electrically connected to the peripheral circuits via the peripheral contact plugs 31. For example, the peripheral circuit plugs 31 and the peripheral interconnection lines 33 and 40 may be connected to the NMOS and PMOS transistors.

The lower insulating gapfill layer 50 may be disposed on the semiconductor substrate 10 to cover the peripheral circuits, the peripheral circuit plugs 31, and the peripheral interconnection lines 33 and 40. The lower insulating gapfill layer 50 may include a plurality of sequentially-stacked insulating layers.

The cell array structure CS may be disposed on the lower insulating gapfill layer 50 and may include a horizontal semiconductor layer 100, a plurality of stacks ST, and a plurality of vertical structures VS.

The horizontal semiconductor layer 100 may be disposed on the top surface of the lower insulating gapfill layer 50 covering the peripheral circuits. For example, a bottom surface of the horizontal semiconductor layer 100 may be in contact with a top surface of the lower insulating gapfill layer 50. As illustrated in FIG. 4, the horizontal semiconductor layer 100 may include a cell array region CAR and contact regions CTR adjacent to the cell array region CAR. For example, the contact regions CTR may be adjacent to each side of a cell array region CAR.

The horizontal semiconductor layer 100 may be formed of a semiconductor material (e.g., silicon (Si), germanium (Ge), silicon germanium (SiGe), gallium arsenic (GaAs), indium gallium arsenic (InGaAs), aluminum gallium arsenic (AlGaAs), or compounds thereof). In certain embodiments, the horizontal semiconductor layer 100 may be formed of or include at least one of doped semiconductor materials (e.g., of a first conductivity type) and/or intrinsic semiconductor materials. The horizontal semiconductor layer 100 may be formed to have one of polycrystalline, amorphous, and single-crystalline structures. The horizontal semiconductor layer 100 may have a thickness ranging from about 3000 Å to about 6000 Å. Other technical issues associated with the horizontal semiconductor layer 100 will be described in more detail with reference to FIGS. 8 through 18.

On the horizontal semiconductor layer 100, the stacks ST may extend in the first direction D1 and may be arranged spaced apart from each other in the second direction D2.

Each of the stacks ST may include electrodes EL, which are vertically stacked on the horizontal semiconductor layer 100, and interlayered insulating layers ILD, which are interposed between the electrodes EL. In the stacks ST, a thickness of each of the interlayered insulating layers ILD may be changed, depending on technical requirements for the semiconductor memory device. For example, the lowermost one of the interlayered insulating layers ILD may be thinner than the others of the interlayered insulating layers ILD. Furthermore, at least one of the interlayered insulating layers ILD may be thicker than the remaining ones of the interlayered insulating layers ILD.

The stacks ST may be provided to have a staircase structure on the contact region CTR, and the staircase structure may make it possible to allow the electrodes EL to be electrically connected to the peripheral logic structure PS. An upper insulating gapfill layer 121 may be disposed on the horizontal semiconductor layer 100 to cover end portions of the electrodes EL constituting the staircase structure. In addition, a capping insulating layer 123 may be provided to cover the plurality of the stacks ST and the upper insulating gapfill layer 121. For example, the capping insulating layer 123 may be provided on a top surface of the insulating gapfill layer 121. The bit lines BL may be disposed on the capping insulating layer 123 to extend in the second direction D2 or across the stacks ST. For example, the bit lines BL may be disposed on a top surface of the capping insulating layer 123. The bit lines BL may be electrically connected to the vertical structures VS through bit line contact plugs BPLG.

In some embodiments, the 3D semiconductor memory device may be a vertical-type NAND FLASH memory device, and in these embodiments, some of the electrodes EL may serve as control gate electrodes of the memory cells. For example, the electrodes EL, other than the uppermost and lowermost electrodes, may be used as the control gate electrodes or as word lines for connecting the control gate electrodes to each other. The electrodes EL, other than the uppermost and lowermost electrodes EL, in conjunction with the vertical structures VS, may constitute the memory cells. Accordingly, the memory cells may be three-dimensionally arranged on the horizontal semiconductor layer 100 to constitute the cell strings CSTR of FIG. 3. In the stacks ST, the lowermost and uppermost ones of the electrodes EL may be used as gate electrodes of the selection transistors SST and GST of FIG. 3. For example, the uppermost one of the electrodes EL may be used as a gate electrode of the string selection transistor (e.g., SST of FIG. 3) for controlling an electric connection between the bit line BL and the vertical structures VS, and the lowermost one of the electrodes EL may be used as a gate electrode of the ground selection transistor (e.g., GST of FIG. 3) for controlling an electric connection between a common source region 110 and the vertical structures VS.

The vertical structures VS may be provided to pass through each of the stacks ST and may be electrically connected to the horizontal semiconductor layer 100. Each of the vertical structures VS may include a portion formed of a semiconductor material. The vertical structures VS may be provided in such a way that bottom surfaces thereof are positioned between top and bottom surfaces of the horizontal semiconductor layer 100. For example, bottom surfaces of the vertical structures VS may be embedded in the horizontal semiconductor layer 100. Contact pads may be provided on the vertical structures VS, respectively, and the bit line contact plugs BPLG may be respectively connected to the contact pads.

As an example, referring to FIGS. 5 and 6, each of the vertical structures VS may include a first semiconductor pattern SP1 in contact with the horizontal semiconductor layer 100 and a second semiconductor pattern SP2 interposed between the first semiconductor pattern SP1 and a data storing layer DS. The first semiconductor pattern SP1 may be shaped like a circular pillar or solid column, but in certain embodiments, the first semiconductor pattern SP1 may be shaped like a hollow pipe or cylinder. The first semiconductor pattern SP1 may include a closed bottom portion, and an inner space of the first semiconductor pattern SP1 may be filled with an insulating gap-fill pattern VI. The first semiconductor pattern SP1 may be in contact with an inner surface of the second semiconductor pattern SP2 and the top surface of the horizontal semiconductor layer 100. For example, the first semiconductor pattern SP1 may electrically connect the second semiconductor pattern SP2 to the horizontal semiconductor layer 100. Furthermore, the first semiconductor pattern SP1 may have a bottom surface positioned at a lower level than the top surface of the horizontal semiconductor layer 100. For example, the first semiconductor pattern SP1 may extend into the horizontal semiconductor layer 100, and a lower portion of the first semiconductor pattern SP1 may be embedded below a top surface of the horizontal semiconductor layer 100. The second semiconductor pattern SP2 may be shaped like a hollow pipe or cylinder whose top and bottom are open. In some embodiments, the first semiconductor pattern SP1 may extend beyond the open bottom of the second semiconductor pattern SP2. The first and second semiconductor patterns SP1 and SP2 may be in an undoped state or may be doped to have the same conductivity type as the horizontal semiconductor layer 100. The first and second semiconductor patterns SP1 and SP2 may have a polycrystalline or single crystalline structure.

Figure 8:
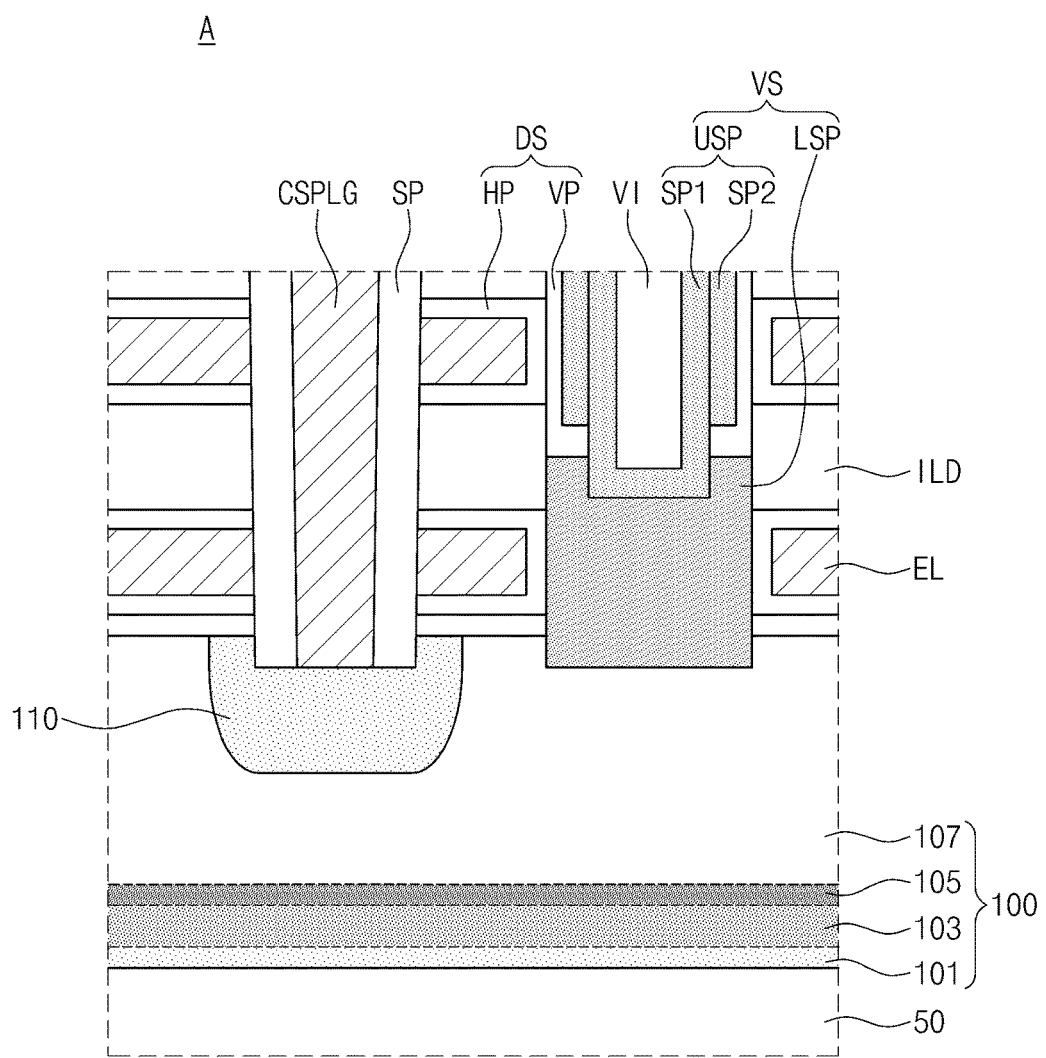
FIGS. 8, 10, 12, 14, and 16 are enlarged sectional views illustrating some examples of a portion 'A' of FIG. 7, according to certain example embodiments.

As another example, referring to FIGS. 7 and 8, each of the vertical structures VS may include a lower semiconductor pattern LSP and an upper semiconductor pattern USP. The lower semiconductor pattern LSP may be provided to pass through a lower portion of the stack ST and be connected to the horizontal semiconductor layer 100, and the upper semiconductor pattern USP may be provided to pass through an upper portion of the stack ST and be connected to the lower semiconductor pattern LSP.

The upper semiconductor pattern USP may be shaped like a hollow pipe or cylinder. Here, the upper semiconductor pattern USP may include a closed bottom portion. An inner space of the upper semiconductor pattern USP may be filled with the insulating gap-fill pattern VI. A bottom surface of the upper semiconductor pattern USP may be positioned at a lower level than a top surface of the lower semiconductor pattern LSP. For example, the upper semiconductor pattern USP may be partially inserted into the lower semiconductor pattern LSP. For example, the upper semiconductor pattern USP may extend into the lower semiconductor pattern LSP, and a lower portion of the upper semiconductor pattern USP may be embedded below a top surface of the lower semiconductor pattern LSP. The upper semiconductor pattern USP may be formed of a semiconductor material. For example, the upper semiconductor pattern USP may be formed of or include at least one of doped or intrinsic semiconductor materials (e.g., of silicon (Si), germanium (Ge), or compounds thereof). The upper semiconductor pattern USP may be formed to have one of polycrystalline, amorphous, and single-crystalline structures. A conductive pad may be provided on the upper semiconductor pattern USP. The conductive pad may be a doped semiconductor pattern or a conductive pattern.

In detail, the upper semiconductor pattern USP may include the first semiconductor pattern SP1 and the second semiconductor pattern SP2. The first semiconductor pattern SP1 may be coupled to the lower semiconductor pattern LSP, and may have a pipe or cylinder shape with a closed bottom and an open top. For example, the first semiconductor pattern SP1 may extend into the lower semiconductor pattern LSP, and a lower portion of the first semiconductor pattern SP1 may be embedded below a top surface of the lower semiconductor pattern LSP. An inner space of the first semiconductor pattern SP1 may be filled with the insulating gap-fill pattern VI. In addition, the first semiconductor pattern SP1 may be in contact with an inner surface of the second semiconductor pattern SP2 and the top surface of the lower semiconductor pattern LSP. For example, the first semiconductor pattern SP1 may allow the second semiconductor pattern SP2 to be electrically connected to the lower semiconductor pattern LSP. The second semiconductor pattern SP2 may cover an inner sidewall of the stack ST. The second semiconductor pattern SP2 may be shaped like a hollow pipe or cylinder whose top and bottom are open. The second semiconductor pattern SP2 may be spaced apart from (i.e., not in contact with) the lower semiconductor pattern LSP. The first and second semiconductor patterns SP1 and SP2 may be in an undoped state or may be doped to have the same conductivity type as the horizontal semiconductor layer 100. The first and second semiconductor patterns SP1 and SP2 may be provided to have a polycrystalline or single crystalline structure.

The lower semiconductor pattern LSP may be used as channel regions of the ground selection transistors GST, as described with reference to FIG. 3. The lower semiconductor pattern LSP may be formed of a semiconductor material, whose conductivity type is the same as the horizontal semiconductor layer 100. As an example, the lower semiconductor pattern LSP may be an epitaxial pattern, which may be formed by an epitaxial process or a laser crystallization process using the horizontal semiconductor layer 100 as a seed semiconductor layer. In some embodiments, the lower semiconductor pattern LSP may be formed to have a single crystalline structure or to have a poly crystalline structure, whose grain size is larger than that of a semiconductor layer formed by a chemical vapor deposition (CVD) process. As another example, the lower semiconductor pattern LSP may be formed to have a poly-crystalline structure (e.g., polysilicon). In some embodiments, an insulating pattern (not shown) in contact with a sidewall of the lower semiconductor pattern LSP may be provided adjacent to the lower semiconductor pattern LSP.

As an example, the lower semiconductor pattern LSP may pass through the lowermost one of the electrodes EL and may have a pillar-shaped structure. In some embodiments, the lower semiconductor pattern LSP may have a solid, pillar-shaped structure. Here, the bottom surface of the lower semiconductor pattern LSP may be positioned below the top surface of the horizontal semiconductor layer 100 and may be spaced apart from the top surface of the lower insulating gapfill layer 50. The top surface of the lower semiconductor pattern LSP may be positioned at a higher level than a top surface of the lowermost one of the electrodes EL.

The data storing layer DS may be disposed between the stacks ST and the vertical structures VS. The data storing layer DS may include a vertical pattern VP, which is provided to pass through the stacks ST, and a horizontal pattern HP, which is extended from a region between the electrodes EL and the vertical pattern VP to cover the top and bottom surfaces of the electrodes EL, as shown in FIGS. 6 and 8.

As an example, the vertical pattern VP of the data storing layer DS may surround sidewalls of the vertical structures VS and to be in direct contact with the horizontal semiconductor layer 100, as shown in FIG. 6. In some embodiments, as illustrated in FIGS. 5 and 6, a lower portion of the vertical pattern VP may be formed around a lower end of the second semiconductor pattern SP2, extending between the second semiconductor pattern SP2 and a fourth semiconductor layer 107. As another example, the vertical pattern VP of the data storing layer DS may be disposed on the lower semiconductor pattern LSP to enclose a sidewall of the upper semiconductor pattern USP, as shown in FIG. 8. In other embodiments, as illustrated in FIGS. 7 and 8, a lower portion of the vertical pattern VP may be formed around a lower end of the second semiconductor pattern SP2, extending between the second semiconductor pattern SP2 and the lower semiconductor portion LSP. The data storing layer DS will be described in more detail with reference to FIGS. 19 through 22.

The common source regions 110 may be provided between adjacent pairs of the stacks ST and in the horizontal semiconductor layer 100. For example, the common source regions 110 may be disposed below the stacks ST and at lower ends of the vertical structures VS. The common source regions 110 may extend parallel to the stacks ST (i.e., in the first direction D1). The common source regions 110 may be formed by doping the horizontal semiconductor layer 100 with impurities of a second conductivity type. The common source regions 110 may be doped with n-type dopants (e.g., arsenic (As) or phosphorus (P)).

The common source regions 110 may be formed to have an impurity concentration of the n-type dopants ranging from about $1\times10^{19}$ ions/cm$^3$ to about $1\times10^{21}$ ions/cm$^3$.

As illustrated in FIGS. 6 and 8, a common source plug CSPLG may be coupled to the common source region 110. Insulating sidewall spacers SP may be interposed between the common source plug CSPLG and the stacks ST. When a read or programming operation is performed on the 3D semiconductor memory device, a ground voltage may be applied to the common source region 110 through the common source plug CSPLG. The common source plug CSPLG may have a uniform top width and may extend parallel to the first direction D1. As an example, a pair of the insulating sidewall spacers SP facing each other may be disposed between an adjacent pair of the stacks ST. As another example, the insulating sidewall spacers SP may be provided to fill a space between adjacent pairs of the stacks ST, and the common source plug CSPLG may pass through the insulating sidewall spacers SP and may be locally connected to the common source region 110.

An interconnection structure may be provided on the end portions of the stacks ST (i.e., on the staircase structure) to electrically connect the cell array structure CS to the peripheral logic structure PS. In some embodiments, the upper insulating gapfill layer 121 may be disposed on the horizontal semiconductor layer 100 to cover the end portions of the stacks ST, and the interconnection structure may include contact plugs PLG, which are provided to pass through the upper insulating gapfill layer 121 and the capping insulating layer 123 and are connected to the end portions of the electrodes EL, and connection lines CL, which are provided on the capping insulating layer 123 and are connected to the contact plugs PLG. In some embodiments, each contact plug PLG may pass through an upper insulating gapfill layer 121 and the capping insulating layer 123, and be connected to the end portion of a respective one of the electrodes EL. The contact plugs PLG may be provided in such a way that vertical lengths thereof decrease in a direction toward the cell array region CAR. For example, the vertical lengths of the contact plugs PLG may change (e.g., increase or decrease) in directions relative to the staircase structure of the end portions of the stacks ST.

Referring to FIGS. 4 and 5, pick-up regions 115 may be provided adjacent to both end portions of each of the stacks ST. As illustrated in FIG. 4, the pick-up regions 115 may be provided spaced apart from each other in the first direction D1 at both end portions of the stacks ST. The pick-up regions 115 may be formed by doping the horizontal semiconductor layer 100 with impurities of a first conductivity type. The pick-up regions 115 may have the same conductivity type as the horizontal semiconductor layer 100, but an impurity concentration of the pick-up regions 115 may be higher than that of the horizontal semiconductor layer 100. For example, the pick-up regions 115 may contain p-type impurities (e.g., boron (B)), like the horizontal semiconductor layer 100 of certain exemplary embodiments. However, the pick-up regions 115 may have a higher impurity concentration than that of the horizontal semiconductor layer 100. For example, the impurity concentration (e.g., boron (B)) of the pick-up regions 115 may range from about $1\times10^{19}$ ions/cm$^3$ to about $1\times10^{21}$ ions/cm$^3$.

A pick-up contact plug PPLG may be coupled to each of the pick-up regions 115. The pick-up contact plug PPLG may pass through the upper insulating gapfill layer 121. As an example, the pick-up contact plug PPLG may be connected to a semiconductor layer or the pick-up region 115, which is highly doped with dopants (e.g., boron).

Referring again to FIGS. 5 and 7, the pick-up contact plug PPLG may be connected to peripheral circuits of the peripheral logic structure PS through a well conductive line PCL and the pick-up contact plugs PCT, and this may make it possible to apply an erase voltage to the pick-up region 115 through the well conductive line PCL and the pick-up contact plug PPLG, in an erase operation. The erase voltage of the pick-up region 115 may be applied to the horizontal semiconductor layer 100 positioned below the stacks ST.

In other examples, the pick-up regions 115 may be omitted. For example, the pick-up contact plug PPLG may be directly connected to a highly-boron-doped region formed in the horizontal semiconductor layer 100, as shown in FIG. 7.

The cell array structure CS and the peripheral logic structure PS may be electrically connected to each other via a connection plug 133. The connection plug 133 may pass through the upper insulating gapfill layer 121 and the horizontal semiconductor layer 100 and may be coupled to the peripheral interconnection lines 33 and 40 of the peripheral logic structure PS. An insulating spacer 131 may enclose a sidewall of the connection plug 133, and thus, the connection plug 133 and the horizontal semiconductor layer 100 may be electrically isolated from each other. The insulating spacer 131 and the connection plug 133 may extend through the upper insulating gapfill layer 121, through the horizontal semiconductor layer 100, through the common source region 110, and partially into the lower insulating gapfill layer 50.

FIGS. 8, 10, 12, 14, and 16 are enlarged sectional views illustrating some examples of a portion 'A' of FIG. 7, according to example embodiments. For example, FIGS. 8, 10, 12, 14, and 16 illustrate exemplary embodiments in which each of the vertical structures VS includes a lower semiconductor pattern LSP and an upper semiconductor pattern USP. FIGS. 9, 11, 13, 15, 17, and 18 are graphs illustrating some examples of a doping profile of a horizontal semiconductor layer according to certain example embodiments.

Figure 16:
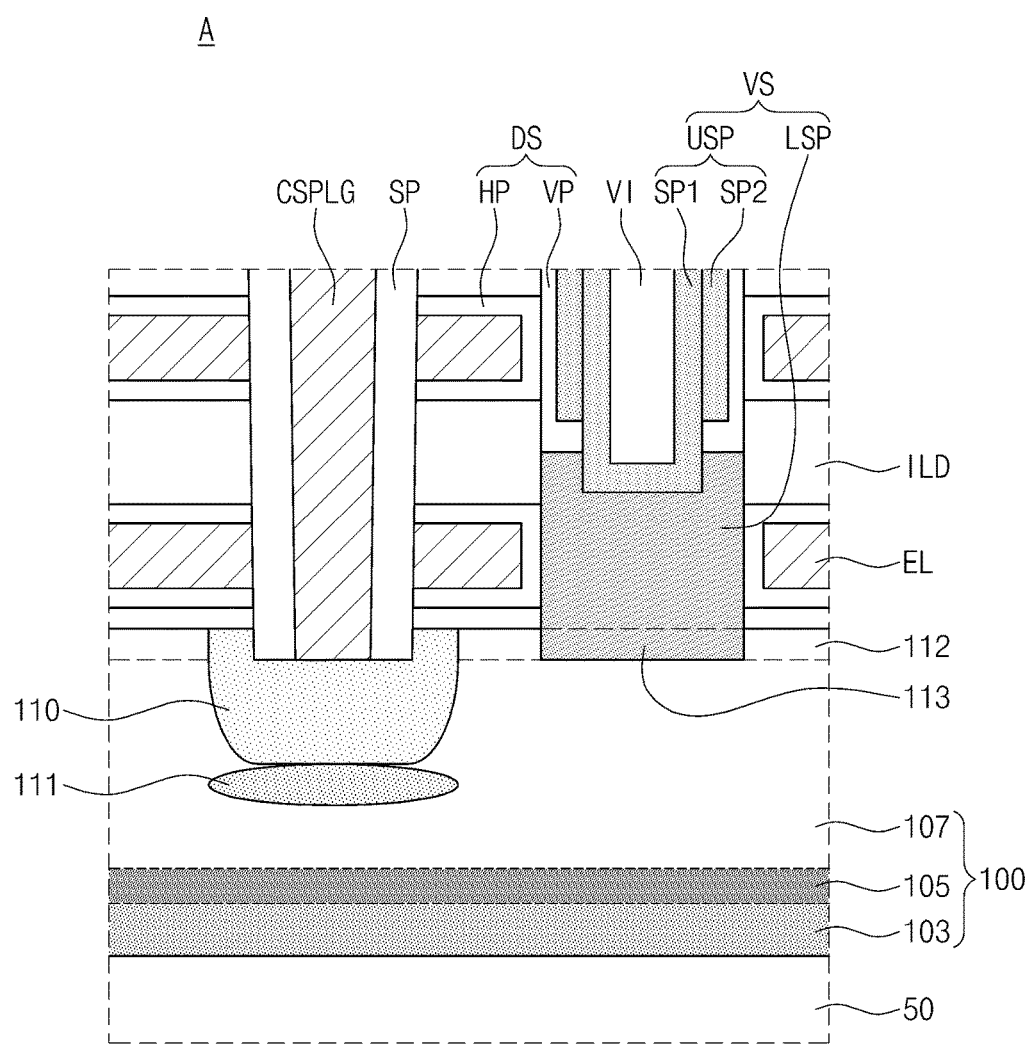
Figure 17:
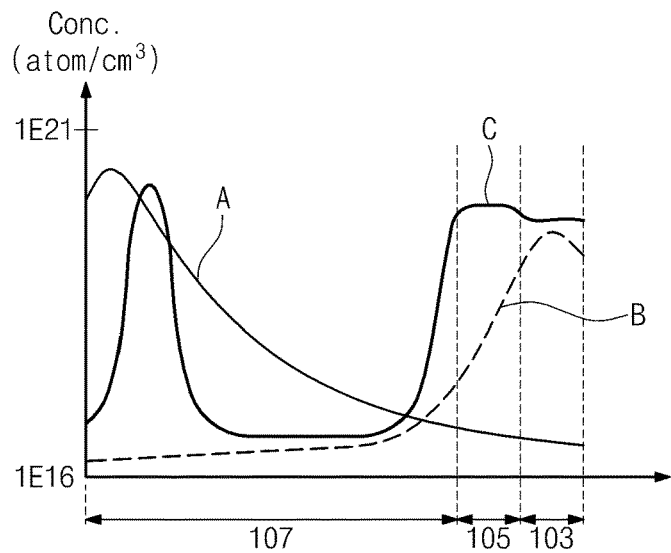
Figure 18:
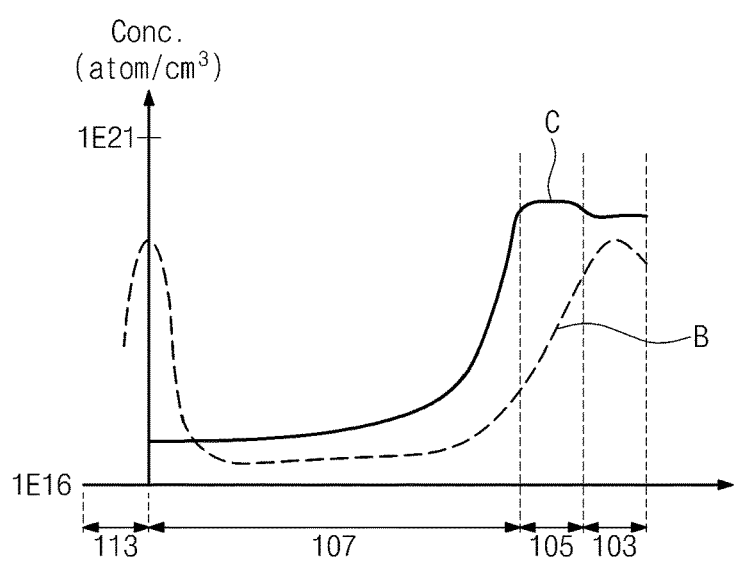

FIGS. 9, 11, 13, 15, and 17 are associated with 3D semiconductor memory devices of FIGS. 8, 10, 12, 14, and 16, respectively, and each of them illustrates an impurity doping profile of a portion of a horizontal semiconductor layer positioned below a common source region. FIG. 18 is associated with a 3D semiconductor memory device of FIG. 16 and illustrates an impurity doping profile of a portion of a horizontal semiconductor layer positioned below a vertical structure. Furthermore, the curves A, B, and C in each of FIGS. 9, 11, 13, 15, 17, and 18 show concentrations of an n-type impurity, a p-type impurity, and an anti-diffusion material, respectively.

Figure 9:
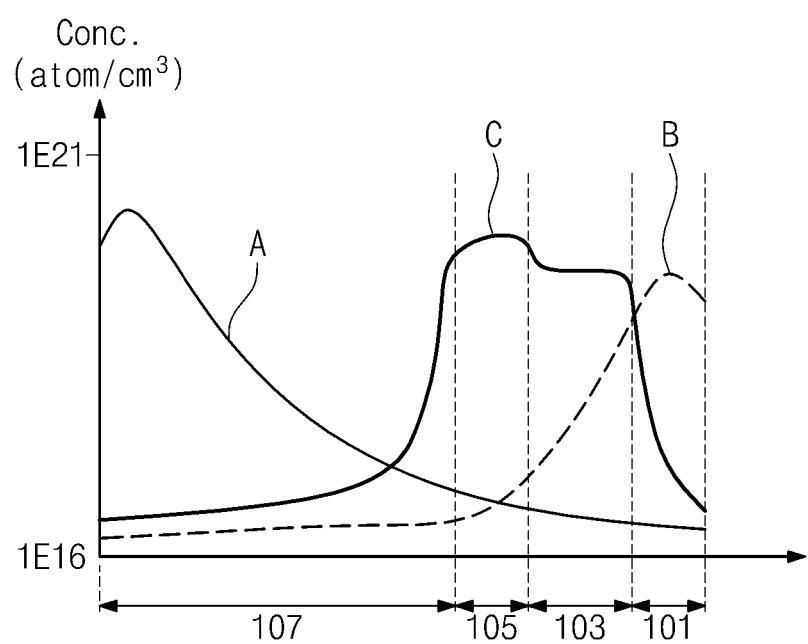
FIGS. 9, 11, 13, 15, 17, and 18 are graphs illustrating some examples of a doping profile of a horizontal semiconductor layer according to certain example embodiments.
Figure 11:
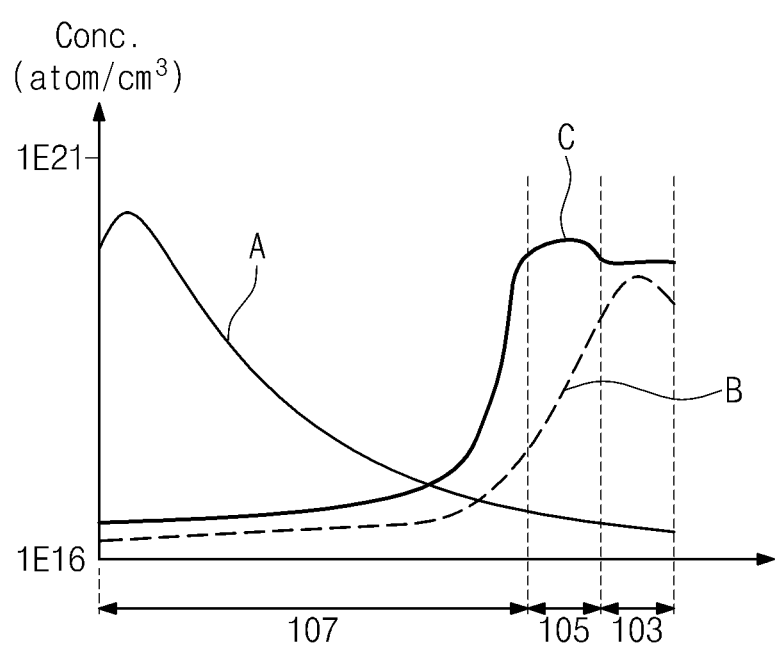
Figure 13:
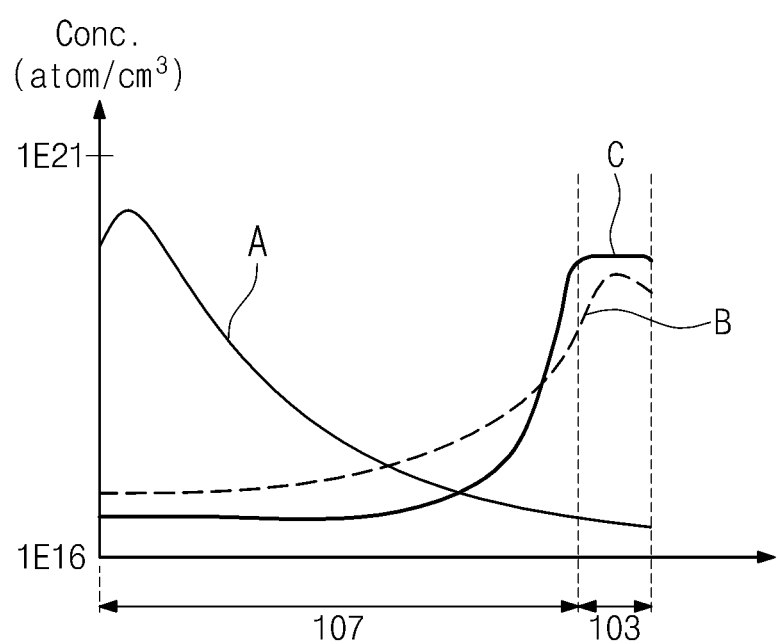
Figure 15:
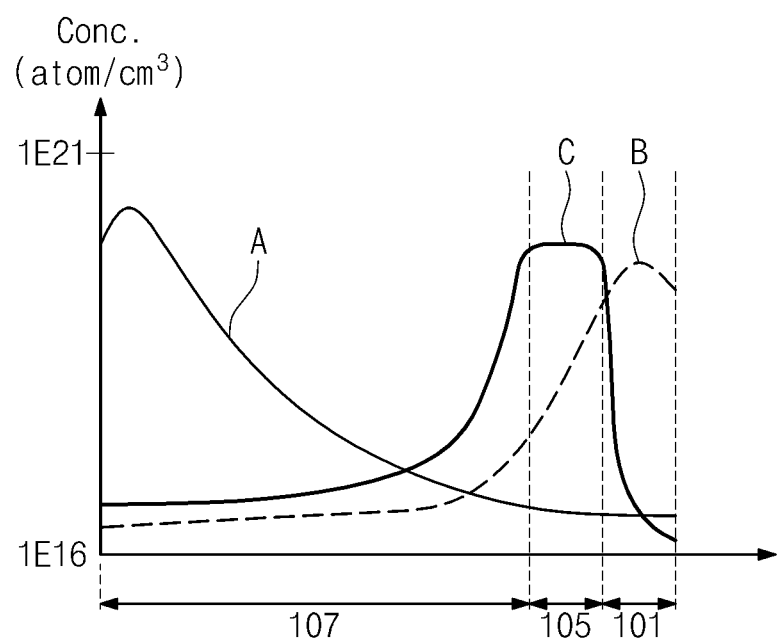

For example, FIG. 9 illustrates concentrations of an n-type impurity (e.g., curve A), a p-type impurity (e.g., curve B), and an anti-diffusion material (e.g., curve C) across a first semiconductor layer 101, a second semiconductor layer 103, a third semiconductor layer 105, and a fourth semiconductor layer 107. FIG. 11 illustrates concentrations of an n-type impurity (e.g., curve A), a p-type impurity (e.g., curve B), and an anti-diffusion material (e.g., curve C) across a second semiconductor layer 103, a third semiconductor layer 105, and a fourth semiconductor layer 107. FIG. 13 illustrates concentrations of an n-type impurity (e.g., curve A), a p-type impurity (e.g., curve B), and an anti-diffusion material (e.g., curve C) across a second semiconductor layer 103 and a fourth semiconductor layer 107. FIG. 15 illustrates concentrations of concentrations of an n-type impurity (e.g., curve A), a p-type impurity (e.g., curve B), and an anti-diffusion material (e.g., curve C) across a first semiconductor layer 101, a third semiconductor layer 105, and a fourth semiconductor layer 107. FIG. 17 illustrates concentrations of an n-type impurity (e.g., curve A), a p-type impurity (e.g., curve B), and an anti-diffusion material (e.g., curve C) across a second semiconductor layer 103, a third semiconductor layer 105, and a fourth semiconductor layer 107. FIG. 18 illustrates concentrations of an n-type impurity (e.g., curve A), a p-type impurity (e.g., curve B), and an anti-diffusion material (e.g., curve C) across a second semiconductor layer 103, a third semiconductor layer 105, a fourth semiconductor layer 107, and a second channel impurity region 113.

Meanwhile, the horizontal semiconductor layer in the 3D semiconductor memory devices of FIGS. 5 and 6 may be configured to have the same technical features as a horizontal semiconductor layer to be described with reference to FIGS. 8 through 18. For example, the horizontal semiconductor layer 100 may include a first semiconductor layer 101, a second semiconductor layer 103, a third semiconductor layer 105, and a fourth semiconductor layer 107, which are sequentially stacked on the lower insulating gapfill layer 50. In some embodiments, the first semiconductor layer 101 may be stacked on the lower insulating gapfill layer 50, the second semiconductor layer 103 may be stacked on the first semiconductor layer 101, the third semiconductor layer 105 may be stacked on the second semiconductor layer 103, and the fourth semiconductor layer 107 may be stacked on the third semiconductor layer 105.

Referring to FIGS. 8 and 9, the horizontal semiconductor layer 100 may include a first semiconductor layer 101, a second semiconductor layer 103, a third semiconductor layer 105, and a fourth semiconductor layer 107, which are sequentially stacked on the lower insulating gapfill layer 50. For example, the first semiconductor layer 101 may be stacked on the lower insulating gapfill layer 50, the second semiconductor layer 103 may be stacked on the first semiconductor layer 101, the third semiconductor layer 105 may be stacked on the second semiconductor layer 103, and the fourth semiconductor layer 107 may be stacked on the third semiconductor layer 105.

The first semiconductor layer 101 may contain p-type impurities and have a first impurity concentration. For example, the first semiconductor layer 101 may be a boron-doped semiconductor layer. The first semiconductor layer 101 may be formed of a boron-doped polycrystalline semiconductor material (e.g., boron-doped polysilicon). In the first semiconductor layer 101, a doping concentration of p-type impurity may range from about $1\times10^{17}$ ions/cm$^3$ to about $1\times10^{21}$ ions/cm$^3$. The first semiconductor layer 101 may have a thickness ranging from about 500 Å to about 2000 Å.

The second semiconductor layer 103 may be a semiconductor layer, in which are included not only an anti-diffusion material but also p-type impurities. The anti-diffusion material may suppress p-type impurities from being diffused into the fourth semiconductor layer 107. For example, the p-type impurity may be boron (B), and the anti-diffusion material may contain carbon (C). As an example, the second semiconductor layer 103 may be a polysilicon layer which is co-doped with carbon (C) and boron (B). A doping concentration of the p-type impurity of the second semiconductor layer 103 may be smaller than that of the first semiconductor layer 101. In the second semiconductor layer 103, a doping concentration of the anti-diffusion material may be higher than that of the p-type impurity. In the second semiconductor layer 103, the doping concentration of the p-type impurity may range from about $1\times10^{17}$ ions/cm$^3$ to about $1\times10^{18}$ ions/cm$^3$. In the second semiconductor layer 103, a doping concentration of the carbon may range from, for example, about $5\times10^{18}$ ions/cm$^3$ to about $1\times10^{21}$ ions/cm$^3$. The second semiconductor layer 103 may be thicker than the first or third semiconductor layers 101 and 105. For example, the second semiconductor layer 103 may have a thickness ranging from about 500 Å to about 2000 Å. Additionally and/or alternatively, the thickness of the second semiconductor layer 103 may be substantially the same as those of the first or third semiconductor layers 101 and 105, as shown in FIG. 6. In some embodiments, for example, the second semiconductor layer 103 may be thicker than the first semiconductor layer 101, and the thickness of the second semiconductor layer 103 may be the same as that of the third semiconductor layer 105. In other exemplary embodiments, the second semiconductor layer 103 may be thicker than the third semiconductor layer 105, and the thickness of the second semiconductor layer 103 may be the same as that of the first semiconductor layer 101.

The third semiconductor layer 105 may be provided to contain the p-type impurities and the anti-diffusion material. The third semiconductor layer 105 may contain the same anti-diffusion material as the second semiconductor layer 103. As an example, a doping concentration of the anti-diffusion material may be higher in the third semiconductor layer 105 than in the second semiconductor layer 103. As another example, the second and third semiconductor layers 103 and 105 may be the same in terms of the doping concentration of the anti-diffusion material. A doping concentration of the p-type impurity may be lower in the third semiconductor layer 105 than in the second semiconductor layer 103. In the third semiconductor layer 105, the doping concentration of the p-type impurity may range from about $1\times10^{16}$ ions/cm$^3$ to about $1\times10^{18}$ ions/cm$^3$. In the third semiconductor layer 105, the doping concentration of the carbon may range from about $5\times10^{18}$ ions/cm$^3$ to about $1\times10^{21}$ ions/cm$^3$. The third semiconductor layer 105 may have a thickness ranging from about 500 Å to about 2000 Å. In the examples shown in FIGS. 8 and 9, the doping concentration of the p-type impurity may be highest at the first semiconductor layer 101 and may be abruptly decreased in the second and third semiconductor layers 103 and 105. For example, the doping concentration may abruptly decrease at the boundary between the first semiconductor layer 101 and the second semiconductor layer 103.

The fourth semiconductor layer 107 may be doped with p-type impurities to have a second impurity concentration lower than the first impurity concentration. In the fourth semiconductor layer 107, the doping concentration of the p-type impurity may range from about $1\times10^{15}$ ions/cm$^3$ to about $1\times10^{17}$ ions/cm$^3$. As another example, the fourth semiconductor layer 107 may be an undoped semiconductor layer.

As an example, the fourth semiconductor layer 107 may have a thickness that is greater than a sum of thicknesses of the first to third semiconductor layers 101, 103, and 105. As another example, the thickness of the fourth semiconductor layer 107 may be greater than a sum of thicknesses of the first and second semiconductor layers 101 and 103. In certain embodiments, the thickness of the fourth semiconductor layer 107 may be greater than about half the thickness of the horizontal semiconductor layer 100. For example, the thickness of the fourth semiconductor layer 107 may range from about 2000 Å to about 4500 Å.

The common source region 110 doped with n-type impurities (e.g., arsenic (As) or phosphorus (P)) may be formed in the fourth semiconductor layer 107. A doping concentration of the n-type impurity may be highest (e.g., about $1\times10^{19}$ ions/cm$^3$ to about $1\times10^{21}$ ions/cm$^3$) near a surface of the fourth semiconductor layer 107. The doping concentration of the n-type impurity may range from about $1\times10^{15}$ ions/cm$^3$ to about $1\times10^{17}$ ions/cm$^3$ at a portion adjacent to the third semiconductor layer 105.

Since the horizontal semiconductor layer 100 includes the first semiconductor layer 101 that is highly doped with dopants (e.g., boron), it is possible to reduce sheet resistance of the horizontal semiconductor layer 100 when an erase voltage for an erase operation of a 3D semiconductor device is applied to pick-up regions 115 (e.g., of FIG. 5) of the horizontal semiconductor layer 100 to supply holes to the vertical structures VS. For example, when an erase voltage is applied to pick-up regions 115 to supply holes to the vertical structures VS, a sheet resistance of the horizontal semiconductor layer 100 may be reduced. This may make it possible to increase an erase operation speed of 3D semiconductor memory device. In addition, since the horizontal semiconductor layer 100 includes the second and third semiconductor layers 103 and 105 containing the anti-diffusion material, it is possible to suppress dopants (e.g., boron) from being diffused into the fourth semiconductor layer 107. For example, it is possible to suppress the dopants (e.g., boron) from being diffused through a grain boundary of the horizontal semiconductor layer 100 (e.g., formed of polysilicon), and consequently to reduce or suppress junction leakage, which may occur at pn junctions of the fourth semiconductor layer 107.

Figure 10:
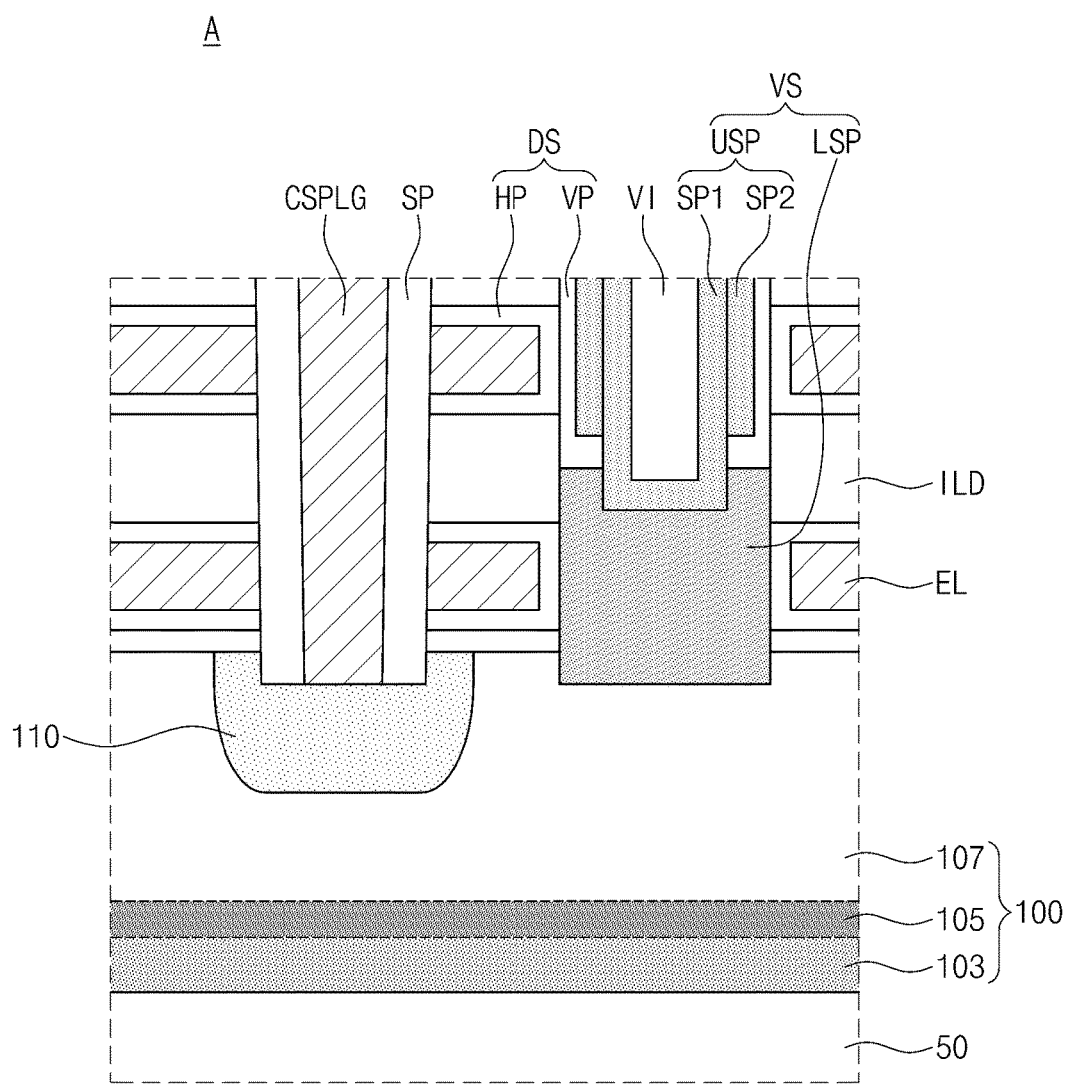

Referring to FIGS. 10 and 11, the horizontal semiconductor layer 100 may include the second semiconductor layer 103, the third semiconductor layer 105, and the fourth semiconductor layer 107, which are sequentially stacked on the lower insulating gapfill layer 50. For example, the second semiconductor layer 103 may be stacked on the lower insulating gapfill layer 50, the third semiconductor layer 105 may be stacked on the second semiconductor layer 103, and the fourth semiconductor layer 107 may be stacked on the third semiconductor layer 105.

The second semiconductor layer 103 may be a semiconductor layer that is co-doped with p-type impurities and an anti-diffusion material, and the third semiconductor layer 105 may be a semiconductor layer doped with the anti-diffusion material. The fourth semiconductor layer 107 may be a semiconductor layer, which is doped with p-type impurities, or an undoped semiconductor layer. For example, the p-type impurities may be boron (B), and the anti-diffusion material may be carbon (C).

The second semiconductor layer 103 may be doped with p-type impurities to have a first impurity concentration, and the third and fourth semiconductor layers 105 and 107 may be doped with p-type impurities to have a second impurity concentration lower than the first impurity concentration. The doping concentration of the p-type impurity may be higher in the second semiconductor layer 103 than in the third and fourth semiconductor layers 105 and 107. Due to the presence of the anti-diffusion material, the doping concentration of the p-type impurity may be abruptly decreased in the third semiconductor layer 105. For example, the doping concentration may abruptly change at the boundary between the second semiconductor layer 103 and the third semiconductor layer 105.

The doping concentration of the anti-diffusion material may be higher in the third semiconductor layer 105 than in the second semiconductor layer 103. Alternatively, the second and third semiconductor layers 103 and 105 may be equal to each other, in terms of doping concentration of the anti-diffusion material. In the second semiconductor layer 103, the doping concentration of the p-type impurity may be higher than doping concentration of the anti-diffusion material.

The fourth semiconductor layer 107 may have a thickness greater than a sum of the thicknesses of second and third semiconductor layers 103 and 105. The thickness of the fourth semiconductor layer 107 may be greater than about half a total thickness of the horizontal semiconductor layer 100. For example, the thickness of the fourth semiconductor layer 107 may range from about 2000 Å to about 4500 Å.

The second semiconductor layer 103, in which the p-type impurities and the anti-diffusion material are co-doped, may have a thickness greater than that of the third semiconductor layer 105 doped with the anti-diffusion material.

Figure 12:
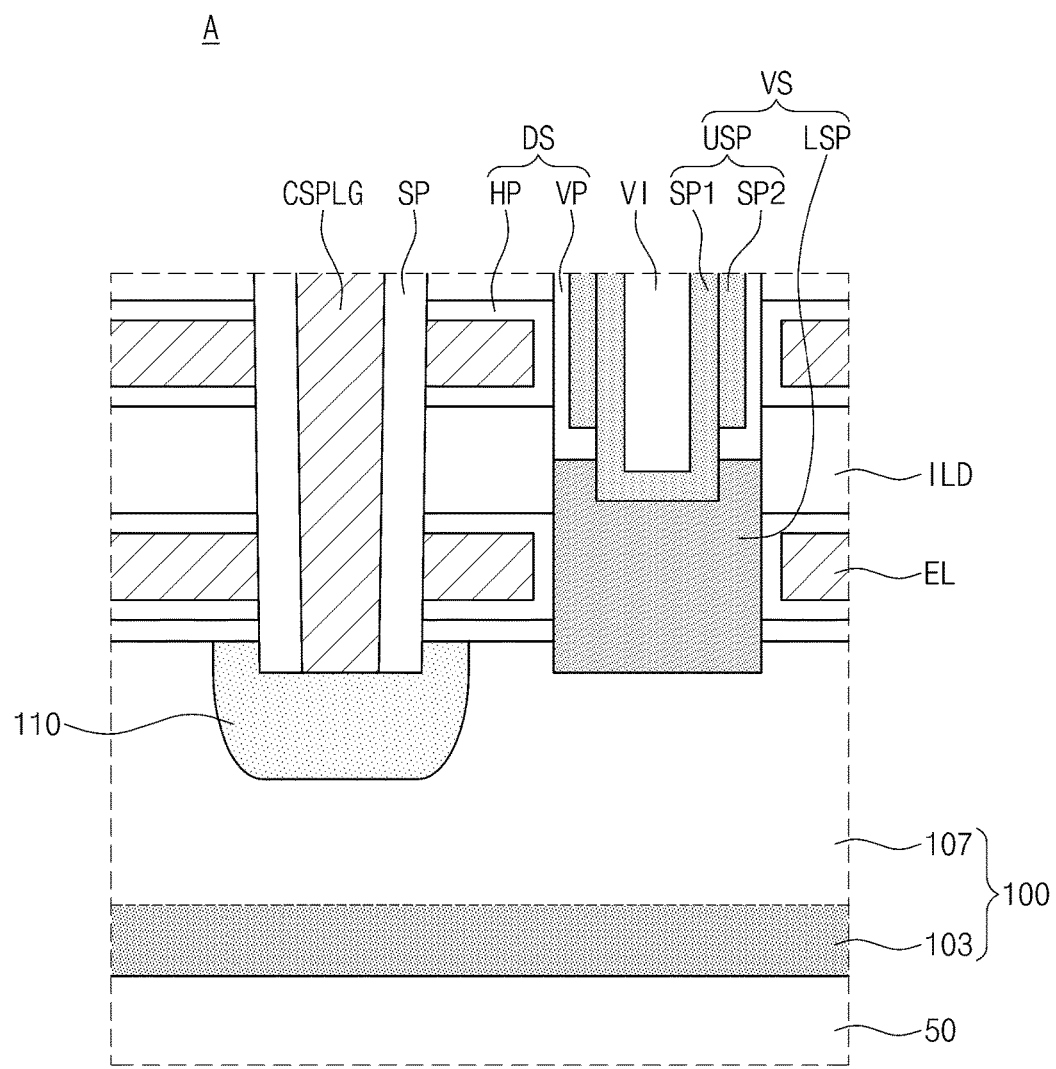

Referring to FIGS. 12 and 13, the horizontal semiconductor layer 100 may include the second semiconductor layer 103, and the fourth semiconductor layer 107, which are sequentially stacked on the lower insulating gapfill layer 50. For example, the second semiconductor layer 103 may be stacked on the lower insulating gapfill layer 50, and the fourth semiconductor layer 107 may be stacked on the second semiconductor layer 103.

The second semiconductor layer 103 may be a semiconductor layer that is co-doped with p-type impurities and an anti-diffusion material, and the fourth semiconductor layer 107 may be a semiconductor layer, which is doped with p-type impurities, or an undoped semiconductor layer. The second semiconductor layer 103 may be doped with p-type impurities to have a first impurity concentration, and the fourth semiconductor layer 107 may be doped with p-type impurities to have a second impurity concentration lower than the first impurity concentration. For example, in the second semiconductor layer 103, a doping concentration of the anti-diffusion material may be higher than that of the p-type impurity. The fourth semiconductor layer 107 may include the common source region 110 doped with n-type impurities, and a doping concentration of n-type impurity may be higher than that of the p-type impurity, in a region near a surface of the fourth semiconductor layer 107.

The second semiconductor layer 103 may have a thickness smaller than about half a total thickness of the horizontal semiconductor layer 100. The fourth semiconductor layer 107 may have a thickness greater than about half a total thickness of the horizontal semiconductor layer 100. For example, the thickness of the fourth semiconductor layer 107 may range from about 2000 Å to about 4500 Å.

Figure 14:
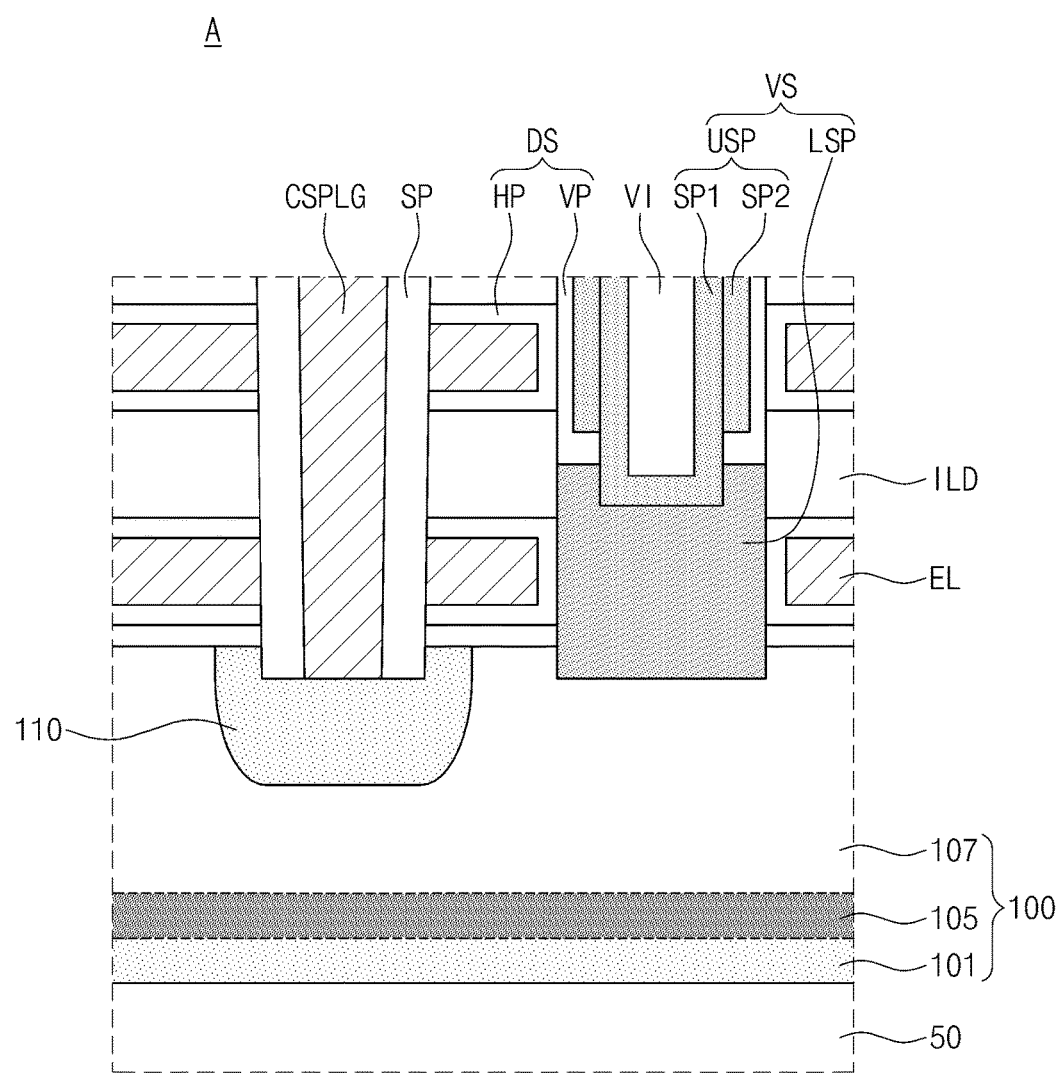

Referring to FIGS. 14 and 15, the horizontal semiconductor layer 100 may include the first semiconductor layer 101, the third semiconductor layer 105, and the fourth semiconductor layer 107, which are sequentially stacked on the lower insulating gapfill layer 50. For example, the first semiconductor layer 101 may be stacked on the lower insulating gapfill layer 50, the third semiconductor layer 105 may be stacked on the first semiconductor layer 101, and the fourth semiconductor layer 107 may be stacked on the third semiconductor layer 105. The first, third, and fourth semiconductor layers 101, 105, and 107 may be formed to contain the p-type impurities, and the third semiconductor layer 105 may be formed to contain the anti-diffusion material.

The first semiconductor layer 101 may be doped with the p-type impurities to have a first impurity concentration, and the fourth semiconductor layer 107 may be doped with the p-type impurities to have a second impurity concentration lower than the first impurity concentration. In the third semiconductor layer 105, a doping concentration of the p-type impurity may be abruptly decreased, and in the third semiconductor layer 105, a doping concentration of the anti-diffusion material may be higher than that of the p-type impurity. For example, the doping concentration may abruptly decrease at the boundary between the first semiconductor layer 101 and the third semiconductor layer 105. A thickness of the third semiconductor layer 105 may be thinner than the fourth semiconductor layer 107 and may be smaller than about half a total thickness of the horizontal semiconductor layer 100.

Referring to FIGS. 16, 17, and 18, the horizontal semiconductor layer 100 may include the second semiconductor layer 103, the third semiconductor layer 105, and the fourth semiconductor layer 107, which are sequentially stacked on the lower insulating gapfill layer 50. For example, the first semiconductor layer 101 may be stacked on the lower insulating gapfill layer 50, the third semiconductor layer 105 may be stacked on the first semiconductor layer 101, and the fourth semiconductor layer 107 may be stacked on the third semiconductor layer 105. The second to fourth semiconductor layers 103, 105, and 107 may be formed to contain the p-type impurities, and the second and third semiconductor layers 103 and 105 may be formed to contain the anti-diffusion material.

The second semiconductor layer 103 may be doped with p-type impurities to have a first impurity concentration, and the fourth semiconductor layer 107 may be doped with p-type impurities to have a second impurity concentration lower than the first impurity concentration. A doping concentration of the p-type impurity may be abruptly decreased in the third semiconductor layer 105. For example, the doping concentration may abruptly decrease at the boundary between the second semiconductor layer 103 and the third semiconductor layer 105. As another example, a doping concentration of the anti-diffusion material may be higher in the third semiconductor layer 105 than in the second semiconductor layer 103. In the third semiconductor layer 105, the doping concentration of the anti-diffusion material may be higher than that of the p-type impurity.

The fourth semiconductor layer 107 may include the common source region 110 and a local impurity region 111. The common source region 110 may extend in one direction between the stacks ST to have a linear shape and may be highly doped with n-type impurities. The local impurity region 111 may be disposed below the common source region 110 to have a linear shape and may be doped with the anti-diffusion material. The anti-diffusion material in the local impurity region 111 may suppress the n-type impurities from being diffused into the fourth semiconductor layer 107. In some embodiments, the anti-diffusion material may be carbon (C). For example, in the local impurity region 111, a doping concentration of the carbon may range from about $5 \times 10^{18}$ ions/cm$^3$ to about $1 \times 10^{21}$ ions/cm$^3$.

Furthermore, a first channel impurity region 112 may be formed in the fourth semiconductor layer 107 and below the lowermost one of the electrodes EL. A second channel impurity region 113 may be formed in a lower portion of the lower semiconductor pattern LSP in contact with the fourth semiconductor layer 107. The first and second channel impurity regions 112 and 113 may contain p-type impurities, and a doping concentration of the p-type impurity may be higher in the second channel impurity region 113 than in the first channel impurity region 112. A concentration of the p-type impurity in the first channel impurity region 112 may be higher than that in the fourth semiconductor layer 107. The first and second channel impurity regions 112 and 113 may serve as channel regions of MOS transistors including the lowermost one of the electrodes EL and the horizontal semiconductor layer 100. In the first channel impurity region 112, a doping concentration of the p-type impurity may range from about $1 \times 10^{15}$ ions/cm$^3$ to about $1 \times 10^{18}$ ions/cm$^3$. In the second channel impurity region 113, the doping concentration of the p-type impurity may range from about $1 \times 10^{19}$ ions/cm$^3$ to about $1 \times 10^{20}$ ions/cm$^3$.

FIGS. 19 through 22 are enlarged sectional views illustrating a portion 'B' of FIGS. 5 and 7. Hereinafter, a data storing layer according to example embodiments may be will be described in more detail with reference to FIGS. 19 through 22.

In some embodiments, the 3D semiconductor memory device may be a NAND FLASH memory device. In this case, a data storing layer DS may be provided between the stack ST and the vertical structure VS, and the data storing layer DS may include a tunnel insulating layer TIL, a charge storing layer CIL, and a blocking insulating layer BLK. Data stored in the data storing layer DS may be changed using a Fowler-Nordheim FN tunneling effect, which may be caused by a voltage difference between the vertical structure VS and the electrodes EL.

Figure 19:
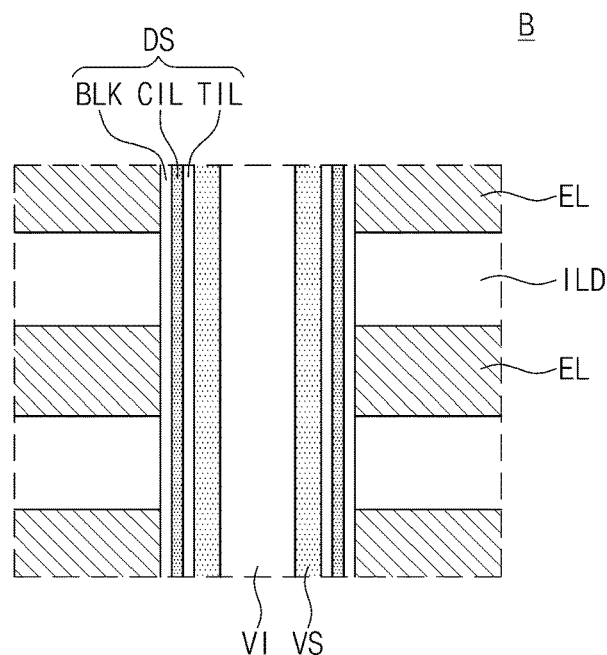
FIGS. 19 through 22 are enlarged sectional views illustrating some examples of a portion 'B' of FIG. 7, according to certain example embodiments.

As shown in FIG. 19, a tunnel insulating layer TIL, a charge storing layer CIL, and a blocking insulating layer BLK may extend from a region between the electrodes EL and the vertical structure VS to another region between the interlayered insulating layer ILD and the vertical structure VS. For example, the tunnel insulating layer TIL, the charge storing layer CIL, and the blocking insulating layer BLK may be formed between the stack ST and the vertical structure VS and extend from the topmost electrode EL and/or interlayered insulating layer ILD to the lowermost electrode EL and/or interlayered insulating layer ILD.

Figure 20:
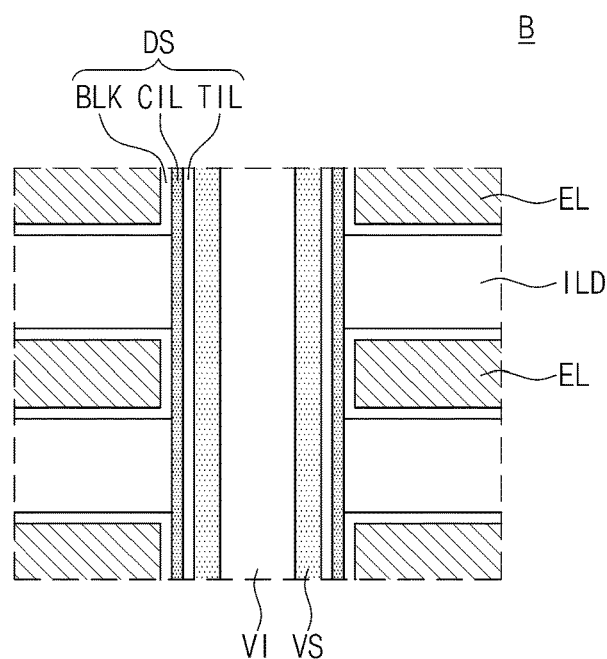

As shown in FIG. 20, the tunnel insulating layer TIL and the charge storing layer CIL may extend from a region between the electrodes EL and the vertical structure VS to another region between the interlayered insulating layer ILD and the vertical structure VS. The blocking insulating layer BLK may be extended from a region between the electrodes EL and the vertical structure VS to cover top surfaces and bottom surfaces of the electrodes EL. For example, the tunnel insulating layer TIL and the charge storing layer CIL may be formed between the stack ST and the vertical structure VS and extend from the topmost electrode EL and/or interlayered insulating layer ILD to the lowermost electrode EL and/or interlayered insulating layer ILD. The block insulating layer BLK may be formed between the charge storing layer CIL and the electrodes, wrapping around top, bottom, and certain side surfaces of the electrodes EL.

Figure 21:
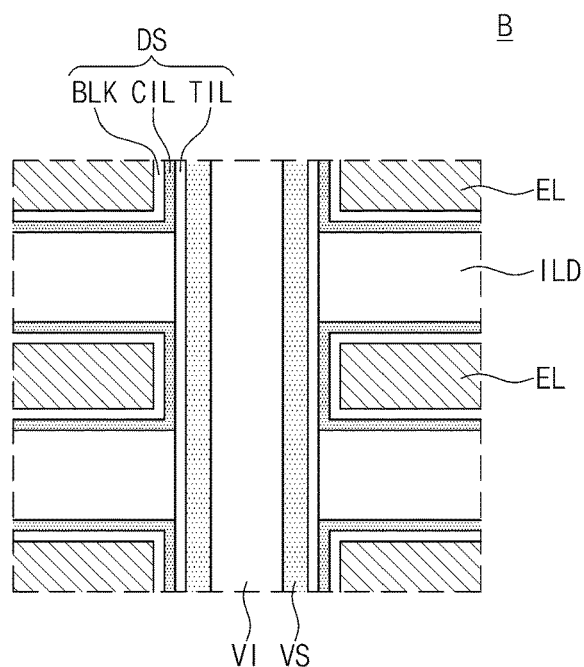

As shown in FIG. 21, the tunnel insulating layer TIL may be extended from a region between the electrodes EL and the vertical structure VS to another region between the interlayered insulating layer ILD and the vertical structure VS, and the charge storing layer CIL and the blocking insulating layer BLK may extend from a region between the electrodes EL and the vertical structure VS to cover top surfaces and bottom surfaces of the electrodes EL. For example, the tunnel insulating layer TIL may be formed between the stack ST and the vertical structure VS and extend from the topmost electrode EL and/or interlayered insulating layer ILD to the lowermost electrode EL and/or interlayered insulating layer ILD. The charge storing layer CIL and the block insulating layer BLK may be formed between the tunnel insulating layer TIL and the electrodes, wrapping around top, bottom, and certain side surfaces of the electrodes EL.

Figure 22:
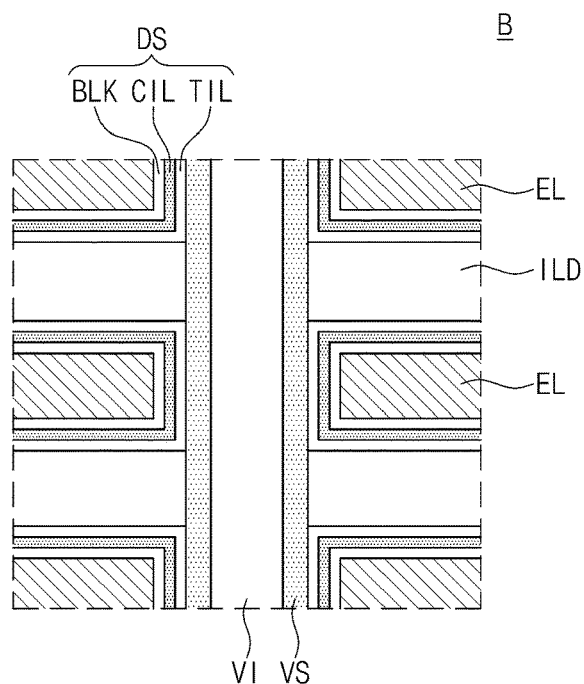

As shown in FIG. 22, the tunnel insulating layer TIL, the charge storing layer CIL, and the blocking insulating layer BLK may extend from a region between the electrodes EL and the vertical structure VS to cover top surfaces and bottom surfaces of the electrodes EL. For example, the tunnel insulating layer TIL, charge storing layer CIL, and the block insulating layer BLK may be formed between the vertical structure VS and the electrodes, wrapping around top, bottom, and certain side surfaces of the electrodes EL.

In the data storing layer DS, the charge storing layer CIL may be one of an insulating layer with many trap sites and an insulating layer with nano particles, and may be formed by a CVD or atomic layer deposition (ALD) process. For example, the charge storing layer CIL may be formed of or include a trap insulating layer, a floating gate electrode, or an insulating layer containing conductive nano dots. In certain embodiments, the charge storing layer CIL may be formed of or include at least one of a silicon nitride layer, a silicon oxynitride layer, a silicon-rich nitride layer, a nanocrystalline silicon layer, or a laminated trap layer.

The tunnel insulating layer TIL may be one of materials having a greater band gap than the charge storing layer CIL and be formed by a CVD or ALD process. For example, the tunnel insulating layer TIL may be a silicon oxide layer, which may be formed by one of the afore-described deposition techniques. After the deposition of the tunnel insulating layer TIL, a thermal treatment process may be further performed on the tunnel insulating layer TIL. The thermal treatment process may be a rapid thermal nitridation (RTN) process or an annealing process that is performed under atmosphere containing at least one of nitrogen and oxygen.

The blocking insulating layer BLK may include first and second blocking insulating layers formed of different materials. In example embodiments, one of the first and second blocking insulating layers may be formed of one of materials whose band gap is smaller than that of the tunnel insulating layer TIL and whose band gap is greater than that of the charge storing layer CIL. The first and second blocking insulating layers may be formed by a CVD or ALD process, and one of them may be formed by a wet oxidation process. As an example, the first blocking insulating layer may be formed of one of high-k dielectrics (e.g., aluminum oxide and hafnium oxide) and the second blocking insulating layer may be formed of a material whose dielectric constant is smaller than the first blocking insulating layer. As another example, the second blocking insulating layer may be formed of one of the high-k dielectrics, and the first blocking insulating layer may be formed of a material whose dielectric constant is smaller than the second blocking insulating layer.

According to example embodiments, a cell array structure may be provided on a peripheral logic structure. The cell array structure may include a horizontal semiconductor layer, which is provided on a top surface of the peripheral logic structure, and memory cells, which are three-dimensionally arranged on the horizontal semiconductor layer.

The horizontal semiconductor layer may include a first semiconductor layer highly doped with dopants (e.g., boron), and this may make it possible to reduce sheet resistance of the horizontal semiconductor layer, when an erase voltage for an erase operation of a three-dimensional semiconductor device is applied to pick-up regions of the horizontal semiconductor layer to supply holes to a vertical structure. In addition, the horizontal semiconductor layer may further include second and third semiconductor layers containing an anti-diffusion material, and this may make it possible to suppress dopants (e.g., boron) in the first semiconductor layer from being diffused into a fourth semiconductor layer including the common source region. Accordingly, it is possible to reduce a leakage current or junction leakage, which may occur in the horizontal semiconductor layer.

While example embodiments have been shown and described, it will be understood by one of ordinary skill in the art that variations in form and detail may be made therein without departing from the spirit and scope of the attached claims.

What is claimed is:

1. A three-dimensional semiconductor memory device, comprising:
    a peripheral logic structure disposed on a semiconductor substrate, the peripheral logic structure comprising peripheral logic circuits integrated on the semiconductor substrate and a lower insulating gapfill layer covering the peripheral logic circuits;
    a horizontal semiconductor layer disposed on the peripheral logic structure;
    stacks disposed on the horizontal semiconductor layer, each of the stacks comprising a plurality of electrodes vertically stacked on the horizontal semiconductor layer; and
    a plurality of vertical structures passing through the stacks and connected to the horizontal semiconductor layer,
    wherein the horizontal semiconductor layer comprises:
    a first semiconductor layer on the lower insulating gapfill layer, the first semiconductor layer being co-doped with an anti-diffusion material and first conductivity type impurities of a first impurity concentration; and
    a second semiconductor layer on the first semiconductor layer, the second semiconductor layer being one of undoped with the first conductivity type impurities or doped with first conductivity type impurities of a second impurity concentration lower than the first impurity concentration,
    wherein portions at a top of the first semiconductor layer and portions at a bottom of the first semiconductor layer are each doped with the anti-diffusion material and the first conductivity type impurities.

2. The three-dimensional semiconductor memory device of claim 1, wherein in the first semiconductor layer, a concentration of the anti-diffusion material is higher than the first impurity concentration of the first conductivity type impurities.

3. The three-dimensional semiconductor memory device of claim 1, wherein the horizontal semiconductor layer further comprises:
    a third semiconductor layer disposed between the lower insulating gapfill layer and the first semiconductor layer,
    wherein the third semiconductor layer is doped with first conductivity type impurities of a third impurity concentration higher than the first impurity concentration of the first conductivity type impurities.

4. The three-dimensional semiconductor memory device of claim 3, wherein a thickness of the second semiconductor layer is greater than a sum of thicknesses of the first and third semiconductor layers.

5. The three-dimensional semiconductor memory device of claim 1, wherein the horizontal semiconductor layer further comprises:
a fourth semiconductor layer disposed between the first and second semiconductor layers,
wherein the fourth semiconductor layer is doped with the anti-diffusion material.

6. The three-dimensional semiconductor memory device of claim 5, wherein a concentration of the anti-diffusion material in the fourth semiconductor layer is higher than a concentration of the anti-diffusion material in the first semiconductor layer.

7. The three-dimensional semiconductor memory device of claim 5, wherein a thickness of the first semiconductor layer is greater than a thickness of the fourth semiconductor layer.

8. The three-dimensional semiconductor memory device of claim 1, wherein the anti-diffusion material contains carbon (C).

9. The three-dimensional semiconductor memory device of claim 1, wherein a thickness of the second semiconductor layer is greater than half a thickness of the horizontal semiconductor layer.

10. The three-dimensional semiconductor memory device of claim 1, wherein the stacks extend parallel to each other in a first direction on the horizontal semiconductor layer,
wherein the second semiconductor layer includes a common source region, which is formed between the stacks to extend in the first direction and is doped with second conductivity type impurities, and
wherein a concentration of the second conductivity type impurities doped in the common source region is higher than the first impurity concentration of the first conductivity type impurities doped in the second semiconductor layer.

11. A three-dimensional semiconductor memory device, comprising:
a peripheral logic structure disposed on a semiconductor substrate, the peripheral logic structure comprising peripheral logic circuits integrated on the semiconductor substrate and a lower insulating gapfill layer covering the peripheral logic circuits;
a horizontal semiconductor layer disposed on the peripheral logic structure, the horizontal semiconductor layer comprising:
a first impurity layer adjacent to the lower insulating gapfill layer and doped with p-type impurities of a first impurity concentration;
a channel layer disposed on the first impurity layer, the channel layer being undoped with the p-type impurities or doped with the p-type impurities of a second impurity concentration lower than the first impurity concentration;
a second impurity layer between the channel layer and the first impurity layer and doped with an anti-diffusion material; and
a third impurity layer between the first and second impurity layers and co-doped with the p-type impurities and the anti-diffusion material;
stacks on the horizontal semiconductor layer, each of the stacks comprising a plurality of electrodes vertically stacked on the horizontal semiconductor layer;
a plurality of vertical structures passing through the stacks and connected to the channel layer; and
a common source region disposed in the channel layer and between the stacks and doped with n-type impurities.

12. The three-dimensional semiconductor memory device of claim 11, wherein a concentration of the p-type impurities is lower in the third impurity layer than in the first impurity layer.

13. The three-dimensional semiconductor memory device of claim 11, wherein the third impurity layer is thicker than the first impurity layer or the second impurity layer.

14. The three-dimensional semiconductor memory device of claim 11, wherein a concentration of the anti-diffusion material is lower in the third impurity layer than in the second impurity layer.

15. The three-dimensional semiconductor memory device of claim 11, wherein a doping concentration of the p-type impurities in the horizontal semiconductor layer gradually decreases in a direction from the peripheral logic structure toward the vertical structures,
wherein a doping concentration of the n-type impurities in the horizontal semiconductor layer gradually decreases in a direction from the vertical structures toward the peripheral logic structure, and
wherein the horizontal semiconductor layer comprises a pn junction formed at a region adjacent to the second impurity layer.

16. A three-dimensional semiconductor memory device, comprising:
a semiconductor substrate;
a peripheral logic structure disposed on a semiconductor substrate, the peripheral logic structure comprising peripheral logic circuits integrated on the semiconductor substrate and a lower insulating gapfill layer covering the peripheral logic circuits;
a horizontal semiconductor layer disposed on the peripheral logic structure, the horizontal semiconductor layer comprising:
a first semiconductor layer adjacent to the lower insulating gapfill layer and co-doped with first conductivity type impurities of a first impurity concentration and an anti-diffusion material; and
a second semiconductor layer disposed on the first semiconductor layer and doped with the anti-diffusion material;
stacks on the horizontal semiconductor layer, each of the stacks comprising a plurality of electrodes vertically stacked on the horizontal semiconductor layer; and
a plurality of vertical structures passing through the stacks and connected to the horizontal semiconductor layer.

17. The three-dimensional semiconductor memory device of claim 16, further comprising:
a third semiconductor layer disposed on the second semiconductor layer, and either undoped with the first conductivity type impurities, or doped with the first conductivity type impurities of a second impurity concentration.

18. The three-dimensional semiconductor memory device of claim 17, wherein the first impurity concentration is greater than the second impurity concentration.

19. The three-dimensional semiconductor memory device of claim 16, wherein the first conductivity type impurities include boron.

20. The three-dimensional semiconductor memory device of claim 16, wherein the anti-diffusion material includes carbon.

21. The three-dimensional semiconductor memory device of claim 1, wherein the first impurity concentration of the first conductivity type impurities is in a range of $1\times10^{17}$ atoms/cm$^3$ to $1\times10^{18}$ atoms/cm$^3$, and a doping concentration of the anti-diffusion material is in a range of $5\times10^{18}$ atoms/cm$^3$ to $1\times10^{21}$ atoms/cm$^3$.

22. The three-dimensional semiconductor memory device of claim 11, wherein a doping concentration of the p-type impurities in the third impurity layer is in a range of $1\times10^{17}$ atoms/cm$^3$ to $1\times10^{18}$ atoms/cm$^3$, and a doping concentration of the anti-diffusion material in the third impurity layer is in a range of $5\times10^{18}$ atoms/cm$^3$ to $1\times10^{21}$ atoms/cm$^3$.

23. The three-dimensional semiconductor memory device of claim 16, wherein the first impurity concentration of the first conductivity type impurities is in a range of $1\times10^{17}$ atoms/cm$^3$ to $1\times10^{18}$ atoms/cm$^3$, and a doping concentration of the anti-diffusion material is in a range of $5\times10^{18}$ atoms/cm$^3$ to $1\times10^{21}$ atoms/cm$^3$.

\* \* \* \* \*